(12) United States Patent
Kida et al.

(10) Patent No.: US 12,527,166 B2
(45) Date of Patent: Jan. 13, 2026

(54) DISPLAY DEVICE HAVING INCREASED LIGHT-EMITTING REGIONS AND METHOD FOR MANUFACTURING SAID DISPLAY DEVICE

(71) Applicant: SHARP KABUSHIKI KAISHA, Sakai (JP)

(72) Inventors: Sentaro Kida, Sakai (JP); Yasushi Asaoka, Sakai (JP); Tsuyoshi Kamada, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 384 days.

(21) Appl. No.: 18/026,343

(22) PCT Filed: Sep. 17, 2020

(86) PCT No.: PCT/JP2020/035335
§ 371 (c)(1),
(2) Date: Mar. 14, 2023

(87) PCT Pub. No.: WO2022/059152
PCT Pub. Date: Mar. 24, 2022

(65) Prior Publication Data
US 2023/0354648 A1     Nov. 2, 2023

(51) Int. Cl.
*H10K 59/122*     (2023.01)
*H10K 59/131*     (2023.01)
(Continued)

(52) U.S. Cl.
CPC ......... *H10K 59/122* (2023.02); *H10K 59/131* (2023.02); *H10K 71/135* (2023.02);
(Continued)

(58) Field of Classification Search
CPC .... H10K 59/122; H10K 59/131; H10K 71/60; H10K 71/135; H10K 71/621
(Continued)

(56) References Cited

U.S. PATENT DOCUMENTS 10,551,656 B2 *  2/2020  Kim .................. G02F 1/133308
11,429,219 B2 *  8/2022  Bae ....................... G06F 3/0443
(Continued)

FOREIGN PATENT DOCUMENTS

JP     2004198486 A     7/2004
JP     2011216250 A     10/2011
(Continued)

*Primary Examiner* — Jami Valentine Miller
(74) *Attorney, Agent, or Firm* — ScienBiziP, P.C.

(57) ABSTRACT

A display device includes: a plurality of first electrodes shaped into islands; a first light-emitting layer formed to overlap with a first electrode among the plurality of the first electrodes, the first light-emitting layer containing a first light-emitting material and resin; a second light-emitting layers formed to overlap with another first electrode among the plurality of the first electrodes, the second light-emitting layers being made of a second light-emitting material; and a bank formed in a shape of a picture frame, or formed to include two partition walls facing each other and separating an inner region from an outer region. The second light-emitting layer is provided behind the bank to be in contact with an inner side face of the bank, and the first light-emitting layer is formed out of the bank.

15 Claims, 14 Drawing Sheets

(51) Int. Cl.
*H10K 71/00* (2023.01)
*H10K 71/13* (2023.01)
*H10K 71/60* (2023.01)
*H10K 59/80* (2023.01)

(52) U.S. Cl.
CPC .......... H10K 71/60 (2023.02); H10K 71/621 (2023.02); *H10K 59/80515* (2023.02); *H10K 59/80521* (2023.02)

(58) Field of Classification Search
USPC .......................................................... 257/40
See application file for complete search history.

(56) References Cited

U.S. PATENT DOCUMENTS

| | | | | |
|---|---|---|---|---|
| 11,456,344 | B2* | 9/2022 | Kim | H10K 59/122 |
| 11,817,049 | B2* | 11/2023 | Ting | G09G 3/3208 |
| 2003/0164681 | A1* | 9/2003 | Fukuoka | H10K 50/846 |
| | | | | 313/512 |
| 2005/0243541 | A1* | 11/2005 | Sibbett | F21V 21/088 |
| | | | | 362/104 |
| 2005/0264473 | A1* | 12/2005 | Sibbett | G09F 21/02 |
| | | | | 345/44 |
| 2007/0080905 | A1* | 4/2007 | Takahara | G09G 3/3258 |
| | | | | 345/76 |
| 2013/0017752 | A1 | 1/2013 | Kajitani | |
| 2018/0108842 | A1 | 4/2018 | Li et al. | |
| 2020/0320959 | A1* | 10/2020 | Ryu | G09G 3/3275 |
| 2021/0005670 | A1* | 1/2021 | Cho | H10K 59/352 |
| 2021/0005681 | A1* | 1/2021 | Chen | G02B 3/0006 |
| 2021/0351244 | A1 | 11/2021 | Asaoka et al. | |
| 2021/0351252 | A1 | 11/2021 | Koike et al. | |
| 2021/0375199 | A1* | 12/2021 | Ting | G09G 3/3208 |
| 2022/0102583 | A1* | 3/2022 | Baumheinrich | G02B 6/12007 |
| 2022/0191994 | A1* | 6/2022 | Huang | H05B 45/14 |
| 2022/0208880 | A1* | 6/2022 | Kim | H10K 50/858 |
| 2022/0223664 | A1* | 7/2022 | Kim | H10K 59/80522 |
| 2023/0354648 | A1* | 11/2023 | Kida | G09F 9/30 |

FOREIGN PATENT DOCUMENTS

| | | |
|---|---|---|
| JP | 2013089401 A | 5/2013 |
| KR | 20150078919 A | 7/2015 |
| WO | 2018225782 A1 | 12/2018 |
| WO | 2020059143 A1 | 3/2020 |
| WO | 2020065963 A1 | 4/2020 |

* cited by examiner

DISPLAY DEVICE HAVING INCREASED LIGHT-EMITTING REGIONS AND METHOD FOR MANUFACTURING SAID DISPLAY DEVICE

TECHNICAL FIELD

The present disclosure relates to a display device and a method for manufacturing the display device.

BACKGROUND ART

Recent years have seen development of various display devices including light-emitting elements. In particular, display devices including quantum-dot light-emitting diodes (QLEDs) or organic light-emitting diodes (OLEDs) are attracting attention because these display devices consume less power, have a thinner profile, and achieve higher image quality.

However, for example, as to a display device including OLEDs, if all the light-emitting layers are formed by vapor deposition, the forming step of the light-emitting layers requires time and costs. Thus, the light-emitting layers cannot be formed efficiently. Hence, methods are being developed increasingly to form light-emitting layers of a display device including QLEDs or OLEDs.

For example, Patent Document 1 below describes how to form a light-emitting layer of a light-emitting element included in a display device, using inkjet printing (ink-drop delivering) alone, in order to form the light-emitting layer efficiently.

CITATION LIST

Patent Literature

[Patent Document 1] Japanese Unexamined Patent Publication Application No. 2004-198486 (published on Jul. 15, 2004)

SUMMARY OF INVENTION

Technical Problems

Patent Document 1 above describes how inkjet printing alone is used to form light-emitting layers, in respective colors, each included in a corresponding one of all the subpixels included in one pixel. In the case of the configuration described in Patent Document 1, all the light-emitting layers are formed by inkjet printing so that the light-emitting layers can be formed efficiently. However, all the subpixels have to include a relatively tall bank partition wall). For its larger height, the bank is formed larger also in width. Hence, the bank inevitably covers a large area of an electrode shaped into an island and included in each subpixel. Such banks cause a problem of reducing light-emitting regions of the light-emitting layers for all the subpixels.

An aspect of the present disclosure is conceived in view of the above problems, and intended to provide a display device including a light-emitting layer having a larger light-emitting region, and a method for manufacturing the display device.

Solution to Problems

In order to solve the above problems, a display device of the disclosure includes:

a substrate;
a plurality of first electrodes formed on a surface of the substrate and shaped into islands;
a first light-emitting layer formed on the surface to overlap with a first electrode among the plurality of the first electrodes, the first light-emitting layer containing a first light-emitting material and resin;
a second light-emitting layer formed on the surface to overlap with an other first electrode among the plurality of the first electrodes, the second light-emitting layer being made of a second light-emitting material, and
a first bank formed in a shape of a picture frame, or formed to include two partition walls facing each other and separating an inner region from an outer region,
wherein the second light-emitting layer is provided behind the first bank to be in contact with an inner side face of the first bank, and
the first light-emitting layer is formed out of the first bank.

In order solve the above problems, a method for manufacturing a display device includes:

a first light-emitting layer forming step of forming, by photolithography, a first light-emitting layer in a plurality of first regions on a surface of a substrate; and
a second light-emitting layer forming step of forming a second light-emitting layer after the first light-emitting layer forming step, the second light-emitting layer being formed not in the plurality of first regions but only in a plurality of second regions on the surface, and the plurality of second regions being different from the plurality of first regions.

Advantageous Effects

According to an aspect of the present disclosure, the first light-emitting layer is provided either out of the first bank or by photolithography that does not require a bank. Such an aspect can provide a display device including a light-emitting layer having a larger light-emitting region, and a method for manufacturing the display device.

DESCRIPTION OF EMBODIMENTS

Embodiments of the present disclosure will be described below, with reference to FIGS. 1 to 15. For the sake of description below, like reference signs designate identical and corresponding features between specific embodiments. Such features might not be elaborated upon repeatedly.

First Embodiment

Figure 1:
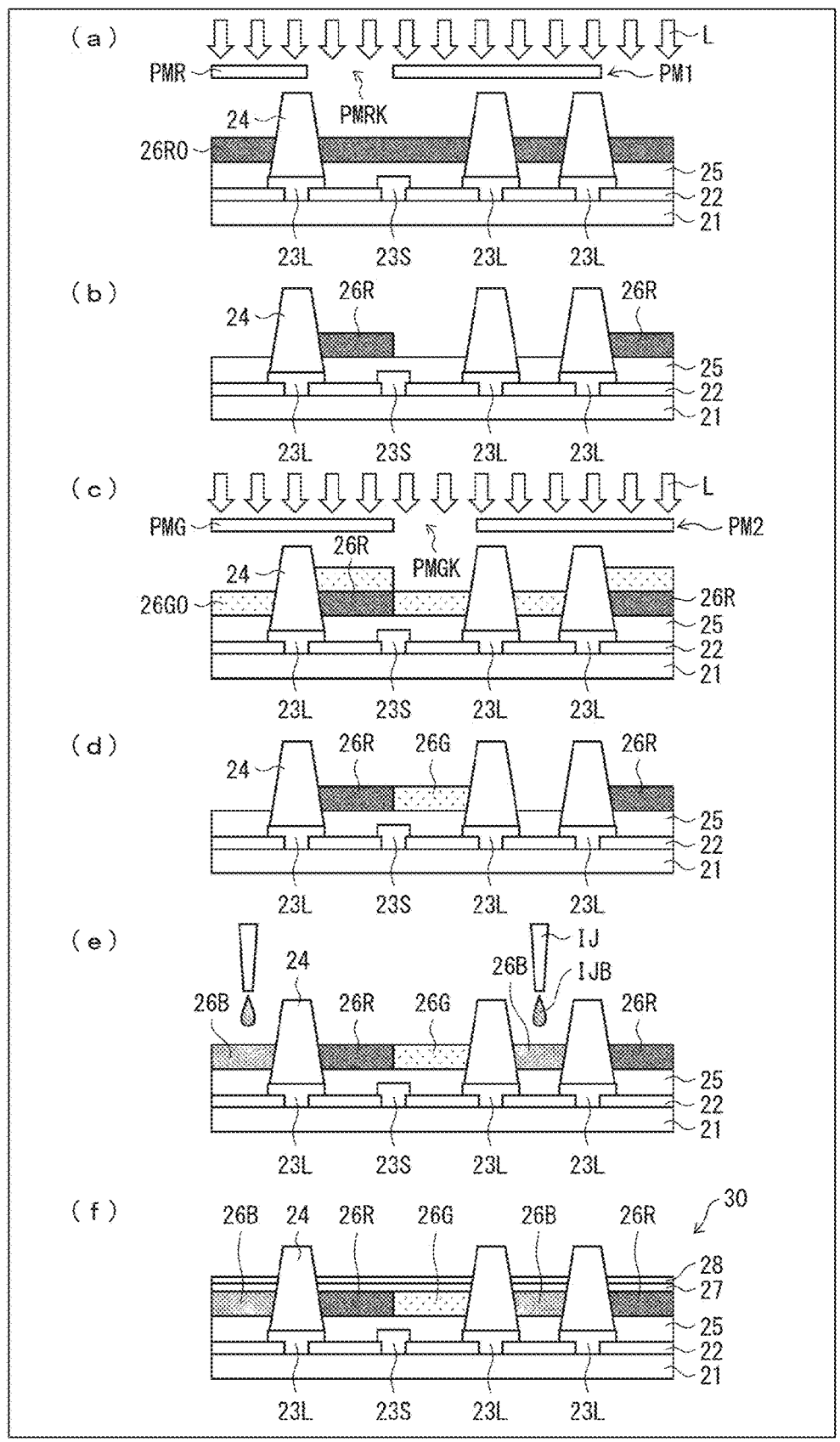
FIG. 1(a) to FIG. 1(f) are views partially illustrating steps of manufacturing a display device of a first embodiment.
Figure 2:
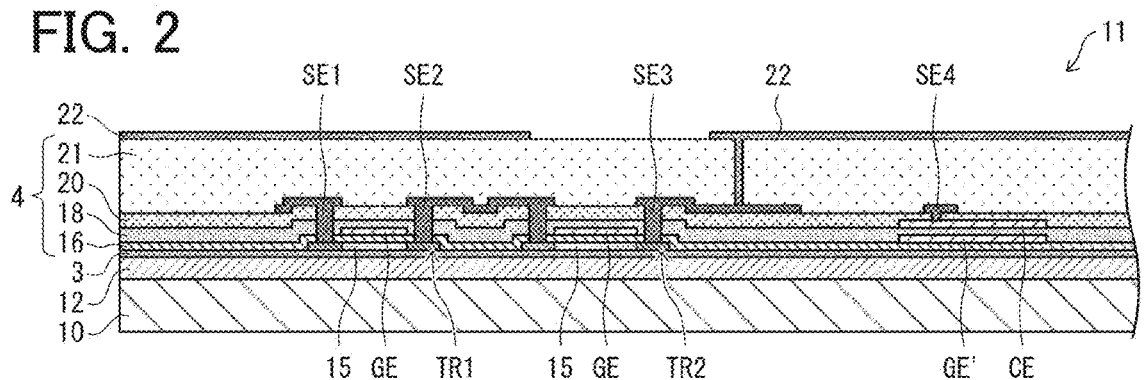
FIG. 2 is a view illustrating an example of an active substrate included in the display device of the first embodiment.

FIG. 2 is a view illustrating an example of an active substrate 11 included in a display device 30 of a first embodiment.

As illustrated in FIG. 2, the active substrate 11 included in the display device 30 of the first embodiment includes a substrate 10. On the substrate 10, the active substrate 11 includes: a resin film 12; a barrier layer 3; a thin-film-transistor layer 4; and a first electrode 22, all of which are provided from toward the substrate 10.

The substrate 10 may be a heat-resistant substrate resistant to heat generated at post processes to form various films. The substrate 10 is, for example, a glass substrate.

The resin film 12 may be formed of, for example, polyimide resin, epoxy resin, or polyamide resin.

The barrier layer 3 keeps transistors TR1 and TR2 and a light-emitting element from water and impurities. The barrier layer 3 can be, for example, a silicon oxide film, a silicon nitride film, or a silicon oxide nitride film formed by the CVD. Alternatively, the barrier layer 3 can be formed of a multi layer film including these films.

The transistors TR1 and TR2 and a capacitive element are provided above the barrier layer 3. The thin-film-transistor layer 4 including the transistors TR1 and TR2 and the capacitive element includes: a semiconductor film 15; an inorganic insulating film (a gate insulating film) 16 above the semiconductor film 15; a gate electrode GE and a capacitive electrode GE' above the inorganic insulating film 16; an inorganic insulating film (a first insulating film) 18 above the gate electrode GE and the capacitive electrode GE'; a counter electrode CE above the inorganic insulating film 18; an inorganic insulating film (a second insulating film) 20 above the counter electrode CE; layers SE1 to SE4 provided above the inorganic insulating film 20 and forming a source electrode, a drain electrode, and a line; and a planarization film (an interlayer insulating film) 21 above the layers SE1 to SE4 forming the source electrode, the drain electrode, and the line.

Note that the capacitive element includes: the counter electrode CE, of the capacitive element, formed directly above the inorganic insulating film 18; the inorganic insulating film 18; and the capacitive electrode GE' formed directly below the inorganic insulating film 18 to overlap, with the counter electrode CE of the capacitive element, in the same layer as a layer in which the gate electrode GE is formed.

The transistors TR1 and TR2 (thin-film transistors TFTs) include: the semiconductor film 15; the inorganic insulating film 16; the gate electrode GE; the inorganic insulating film 18; the inorganic insulating film 20; and the source electrode and the drain electrode.

The semiconductor film 15 is formed of, for example, low-temperature polysilicon (LTPS) or oxide semiconductor.

Each of the layers SE1 to SE4 forming the source electrode, the drain electrode, and the line, the gate electrode GE, the capacitive electrode GE', and the counter electrode CE is formed of a metal monolayer film containing at least one of, for example, aluminum (Al), tungsten (W), molybdenum (Mo), tantalum (Ta), chromium (Cr), titanium (Ti), copper (Cu), or silver (Ag). Alternatively, each layer and electrode is formed of a multilayer film containing these metals.

Each of the inorganic insulating films 16, 18, and 20 can be, for example; a silicon oxide (SiOx) film, a silicon nitride (SiNx) film, or a silicon oxide nitride film formed by the CVD. Alternatively, each of the inorganic insulating films 16, 18, and 20 can be a multilayer film including these films.

The planarization film 21 can be made of, for example, an applicable organic material such as polyimide resin or acrylic resin. Preferably, the planarization film 21 is formed of a photosensitive organic material.

As illustrated in FIG. 2, as to the active substrate 11 included in the display device 30 of this embodiment, the first electrode 22 is shaped into an island. Note that, in this embodiment, for example, the first electrode 22 is a reflective electrode and a cathode, and formed of aluminum (Al). However, the first electrode 22 shall not be limited to such an example. The first electrode 22 may be an anode and a transparent electrode transparent to visible light.

If the first electrode 22 is a reflective electrode, the first electrode 22 may be made of, for example, Ag, Al, MgAl, or MgAg. The first electrode 22 may be a multilayer stack including: a first metal oxide layer conductive of electricity; a metal layer reflective to visible light; and a second metal oxide layer transparent to visible light and conductive of electricity, all of which are stacked on top of another in the stated order. The first metal oxide layer and the second metal oxide layer may be made of a metal oxide selected from indium tin oxide (ITO) and indium zinc oxide (IZO). The metal layer may be made of such a metal as Ag or If the first electrode 22 is a transparent electrode, the first electrode 22 may be made of such a metal as Ag, Al, MgAl, or MgAg and formed to have a thickness that allows visible light to pass through. The first electrode 22 may also be made of such a material as indium tin oxide (ITO), indium zinc oxide (IWO), zinc oxide (e.g., ZnO), tin oxide (e.g., $SnO_2$), titanium oxide (e.g., $TiO_2$), or graphene.

Note that the first electrode 22 is included in each of a plurality of subpixels included in one pixel. The first electrode 22 is driven for each subpixel by, for example, the transistors TR1 and TR2 included in each subpixel.

FIG. 1(a) to FIG. 1(f) are views partially illustrating steps of manufacturing the display device 30 of the first embodiment. Note that FIG. 1(a) to FIG. 1(f) illustrate only the planarization film 21 and the first electrodes 22 of the active substrate 11 in FIG. 2, and omit the other features of the active substrate 11.

The active substrate 11 in FIG. 2 is subjected to: an edge cover forming step of forming edge covers 23L and 23S; a bank forming step of forming banks 24; and a step of forming functional layers 25 toward the first electrodes 22. After that, the active substrate 11 is subjected to: a step of forming first light-emitting layers 26R illustrated in FIG. 1(a) and FIG. 1(b); a step of forming second light-emitting layers 26B illustrated in FIG. 1(e); and a step of forming a third light-emitting layer 26G illustrated in FIG. 1(c) and FIG. 1(d).

At the edge cover forming step, the edge covers 23L and 23S are formed. The edge covers 23L and 23S fill spaces between the plurality of first electrodes 22 formed at a first electrode forming step and each shaped into islands, and cover edges of the plurality of first electrodes 22. As illustrated in FIG. 1(a) to FIG. 1(f), an upper portion of each of the edge covers 23L is provided with a bank 24 large in height. Hence, the edge cover 23L is formed relatively large in width, such that the edge cover 23L and the first electrode 22 overlap with each other in large area. Whereas, an upper portion of the edge cover 23S is not provided with a bank 24. Hence, the edge cover 23S is formed relatively small in width, such that the edge cover 23S and the first electrode 22 overlap with each other in small area.

The edge covers 23L and 23S can be made of, for example, an applicable photosensitive organic material such as polyimide resin or acrylic resin.

The bank 24 can be made of, for example, an applicable photosensitive organic material such as polyimide resin or acrylic resin.

The edge cover forming step and the bank forming step may be a single step using the same material. In this embodiment, an exposing step and a developing step are carried out to simultaneously form the edge covers 23L and 23S and the banks 24. The exposing step is carried out using a photosensitive organic material including acrylic resin, and a mask (e.g., a half-tone mask or a shadow mask) for controlling the amount of light on an exposure region. However, the edge covers 23L and 23S and the banks 24 may be formed by any given technique.

Each functional layer 25 formed at the step of forming the functional layer 25 toward the first electrode 22 is at least one of a hole-injection layer or a hole-transport layer if the first electrode 22 is an anode. The functional layer 25 is at least one of an electron-injection layer or an electron-transport layer if the first electrode 22 is a cathode. The functional layer 25 toward the first electrode 22 may be formed by, for example, either application or vapor deposition. Note that, in forming the functional layer 25, a mask may be or may not be used as necessary. Moreover, the functional layer 25 toward the first electrode 22 may be formed of, for example, nanoparticles of such a material as ZnO or NiO doped with such a material as Al, Mg, Li, or Ga, or nanoparticles of such a material as non-doped ZnO. The functional layer 25 toward the first electrode 22 may be formed of a mixture, of nanoparticles and a photosensitive material, patterned by exposure and development.

In this embodiment, the first electrode 22 is a cathode, and the functional layer 25 toward the first electrode 22 is an electron-transport layer (ETL) that can be made of such a material as $Alq_3$, BCP, $Cs_2O_3$, ZnO, $SnO_2$, $In_2O_3$ or ZnMgO. Note that if the first electrode 22 is an anode, the functional layer 25 toward the first electrode 22 is a hole-transport layer (ITL) that can be made of TFB, TAPC, CBP, PV-K, or NiO. Note that the functional layer 25 toward the electrode 22 preferably has a thickness of, for example, 200 nm or less.

As illustrated in FIG. 1(a), at the step of forming the first light-emitting layers 26R, first, a resist material 26RO for forming the first light-emitting layers is formed on the whole surface of the functional layers 25 toward the first electrodes 22. The resist material 26RO contains, for example, first quantum dots (a first light-emitting material) containing ligands emitting a red light, a photosensitive resin (e.g., epoxy-based resin or acrylic-based resin), a photo initiator, and a solvent. The resist material 26RO may be formed of any given technique. For example, the resist material 26RO may be formed with such a coater as a spin coater, a slit coater, or a bar coater. The resist material 26RO may also be formed by spraying. Note that, in this embodiment, the resist material 26RO is, for example, but not limited to, a negative material. Alternatively, the resist material 26RO may be a positive material. Note that, in this embodiment, for example, the first light-emitting layers 26R are light-emitting layers emitting a red light, the second light-emitting layers 26B are light-emitting layers emitting a blue light, and the third light-emitting layers 26G are light-emitting layers emitting a green light. However, the light-emitting layers shall not be limited to such light-emitting layers.

In this embodiment, any of the first light-emitting layers 26R, as well as the second light-emitting layers 26B and the third light-emitting layers 26G to be described later, are light-emitting layers containing quantum dots. Each of the quantum dots is structured of, for example, a core and a shell. A material of the core can be, for example: CdSe, InP, ZnSe, ZnS, or ZnTe; a mixture of these materials; CIGS; or a Si-based material. Moreover, a material of the shell can be, for example: ZnSe, ZnS, ZnTe, or CdS; or a mixture of these materials (e.g., ZnSeS). Furthermore, the quantum dots are provided with organic ligands or inorganic ligands. The shell of the quantum dots may have an outer diameter of approximately 1 to 15 nm. Note that the first light-emitting layers 26R, the second light-emitting layers 26B, and the third light-emitting layers 26G may contain quantum dots whose shells have different outer diameters, or may contain different kinds of quantum dots, so that each first light-emitting layer 26R, each second light-emitting layer 26B, and each third light-emitting layer 26G emits light having a different center wavelength. In this embodiment, the shell of second quantum dots contained in the second light-emitting layer 26B and emitting a blue light is smaller in outer diameter than the shell of first quantum dots contained in the first light-emitting layer 26R and emitting a red light and the shell of third quantum dots contained in the third light-emitting layer 267 and emitting a green light. However, the outer diameters of the quantum dots in this embodiment shall not be limited to such outer diameters.

After the resist material 26RO is formed on the whole surface of the functional layers 25 toward the first electrodes 22, the resist material 26RO is prebaked for a predetermined time period at a temperature of, for example, 50 degrees or higher and 120 degrees or lower. Hence, the solvent in the resist material 26RO evaporates, and the resist material 26RO dries.

After that, as illustrated in FIG. 1(a), a phtomask PM1 is used to expose the resist material 26RO with light. The photomask PM1 includes: an opening portion PMRK that allows an exposure light L to pass through; and a light-blocking portion PMR that blocks the exposure light L. Note that the exposure light L has any given intensity. For example, the intensity of the exposure light L can range 10 mJ/cm$^2$ or higher and 1000 mJ/cm$^2$ or lower.

After exposed with the exposure light L, the resist material 26RO is developed with, for example, an alkaline solution, an organic solvent, or water. As illustrated in FIG. 1(b), the first light-emitting layers 26R can be each formed in predetermined regions (first regions). Note that, as seen in this embodiment, if the first light-emitting layers 26R are formed of a negative resist material 26RO, a postbaking step of the first light-emitting layers 26R can be omitted as appropriate. If the resist material 26RO is postbaked, the resist material 26RO may be fired, and postbaked, for a predetermined time period at a temperature of, for example, 80 degrees or higher and 200 degrees or lower, for example, before or after a step of forming the second light-emitting layers 26B by inkjet printing. The second light-emitting layers 26B will be described later. In this embodiment, the first light-emitting layers 26R include: the first quantum dots (the first light-emitting material) containing ligands; and resin, and a thickness of the first light-emitting layers 26R is 1 nm or more and 100 nm or less. However, the thickness of the first light-emitting layers 26R shall not be limited to such a thickness, and may be determined as appropriate. Whereas, if the first light-emitting layers 26R are formed of a positive resist material 26RO, the resist material 26RO is postbaked preferably after the developing step. Note that some positive resist materials might preferably thoroughly be exposed to light after the developing step and before the postbaking step.

As can be seen, the first light-emitting layers 26R can be formed by photolithography.

After that, as illustrated in FIG. 1(c), at the step of forming the third light-emitting layer 26G, first, a resist material 26GO for forming the third light-emitting layers is formed on the first light-emitting layers 26R and on the whole surface of the functional layers 25 toward the first electrodes 22. The resist material 26GO contains, for example, third quantum dots (a third light-emitting material) containing ligands emitting a green light, a photosensitive resin (e.g., epoxy-based resin or acrylic-based resin), a photo initiator, and a solvent. The resist material 26RO may be formed of any given technique. For example, the resist material 26GO may be formed with such a coater as a spin coater, a slit coater, or a bar coater. The resist material 26GO may also be formed by spraying. Note that, in this embodiment, the resist material 26GO is, for example, but not limited to, a negative material. Alternatively, the resist material 26GO may be a positive material.

After the resist material 26GO is formed on the first light-emitting layers 26R and on the whole surface of the functional layers 25 toward the first electrodes 22, the resist material 26GO is prebaked for a predetermined time period at a temperature of, for example, 50 degrees or higher and 120 degrees or lower. Hence, the solvent in the resist material 26GO evaporates, and the resist material 26GO dries.

After that, as illustrated in FIG. 1(c), a photomask PM2 is used to expose the resist material 26GO with light. The photomask PM2 includes: an opening portion PMGK that allows the exposure light 1, to pass through; and a light-blocking portion PMG that blocks the exposure light L. Note that exposure light L has any given intensity. For example, the intensity of the exposure light L can range 10 mJ/cm$^2$ or higher and 1000 mJ/cm$^2$ or lower.

After exposed with the exposure light L, the resist material 26GO is developed with, for example, an alkaline solution, an organic solvent, or water. As illustrated in FIG. 1(d), the third light-emitting layer 26G can be formed in a predetermined region (a third region). Note that, as seen in this embodiment, if the third light-emitting layer 26G is formed of a negative resist material 26GO, a postbaking step of the third light-emitting layer 26G may be omitted as appropriate. If the resist material 26GO is postbaked, the resist material 26GO may be fired, and postbaked, for a predetermined time period at a temperature of, for example, 80 degrees or higher and 200 degrees or lower, for example, before or after a step of forming the second light-emitting layers 26B by inkjet printing. The second light-emitting layers 26B will be described later. In this embodiment, the third light-emitting layer 26G includes: the third quantum dots (the third light-emitting material) containing ligands; and resin, and a thickness of the third light-emitting layer 26G is 1 nm or more and 100 nm or less. However, the thickness of the third light-emitting layer 26G shall not be limited to such a thickness, and may be determined as appropriate. Whereas, if the third light-emitting layer 26G is formed of a positive resist material 26GO, the resist material 26GO is postbaked preferably after the developing step. Note that some positive resist materials might preferably thoroughly be exposed to light after the developing step and before the postbaking step.

As can be seen, the third light-emitting layer 26G can be formed by photolithography.

After that, as illustrated in FIG. 1(e), at a forming step of the second light-emitting layers 26B, an inkjet material IJB for forming the second light-emitting layers is delivered with an inkjet apparatus IJ in droplets behind the banks 24 shaped into a picture frame to surround predetermined regions (second regions). The inkjet material IJB contains the second quantum dots (a second light-emitting material) containing ligands emitting a blue light, and a solvent. Note that the first light-emitting layers 26R and the third light-emitting layer 26G are formed out of the banks 24 formed in a shape of a picture frame.

After that, the inkjet material IJB is treated with heat for a predetermined time period at a temperature of, for example, 50 degrees or higher and 200 degrees or lower, so that the solvent in the inkjet material IJB evaporates. Hence, the second light-emitting layers 26B, which are made of the second quantum dots (the second light-emitting material) containing the ligands, are formed in contact with inner side faces of the banks 24. The second light-emitting layers 26B have a thickness of 1 nm or more and 100 nm or less. In this embodiment, the thickness of the second light-emitting layers 26B is 1 nm or more and 100 nm or less. However, the thickness of the second light-emitting layers 26B shall not be limited to such a thickness, and may be determined as appropriate.

As can be seen, the second light-emitting layers 26B can be formed by inkjet printing (formed of ink delivered in droplets).

After that, as illustrated in FIG. 1(f), functional layers 27 toward second electrodes 28 are formed on the first light-emitting layers 26R, the second light-emitting, layers 26B, and the third light-emitting layer 26G. Note that the functional layers 27 toward the second electrodes 28 preferably have a thickness of, for example, 300 nm or less. After that, the second electrodes 28; that is, electrodes provided in common among all the subpixels, are formed. Hence, the display device 30 is finalized. Note that, although not shown, a light-transparent sealing layer is preferably provided on the second electrode 28. The sealing layer may include, for example: a first inorganic sealing film covering the second electrode 28; an organic sealing layer formed above the first inorganic sealing film; and a second inorganic sealing film covering the organic sealing film.

In this embodiment, the second electrodes 28 are transparent electrodes transparent to visible light and serving as anodes. Hence, the second electrodes 28 are formed of, but not limited to, indium tin oxide (ITO). In this embodiment, each of the second electrodes 28 is an anode, and a functional layer 27 toward the second electrode 28 is at least one of a hole-injection layer or a hole-transport layer. For example, the functional layer 27 toward the second electrode 28 is a hole-transport layer (HTL) that can be made of TFB, TAPC, CBP, PVK, or NiO.

Figure 3:
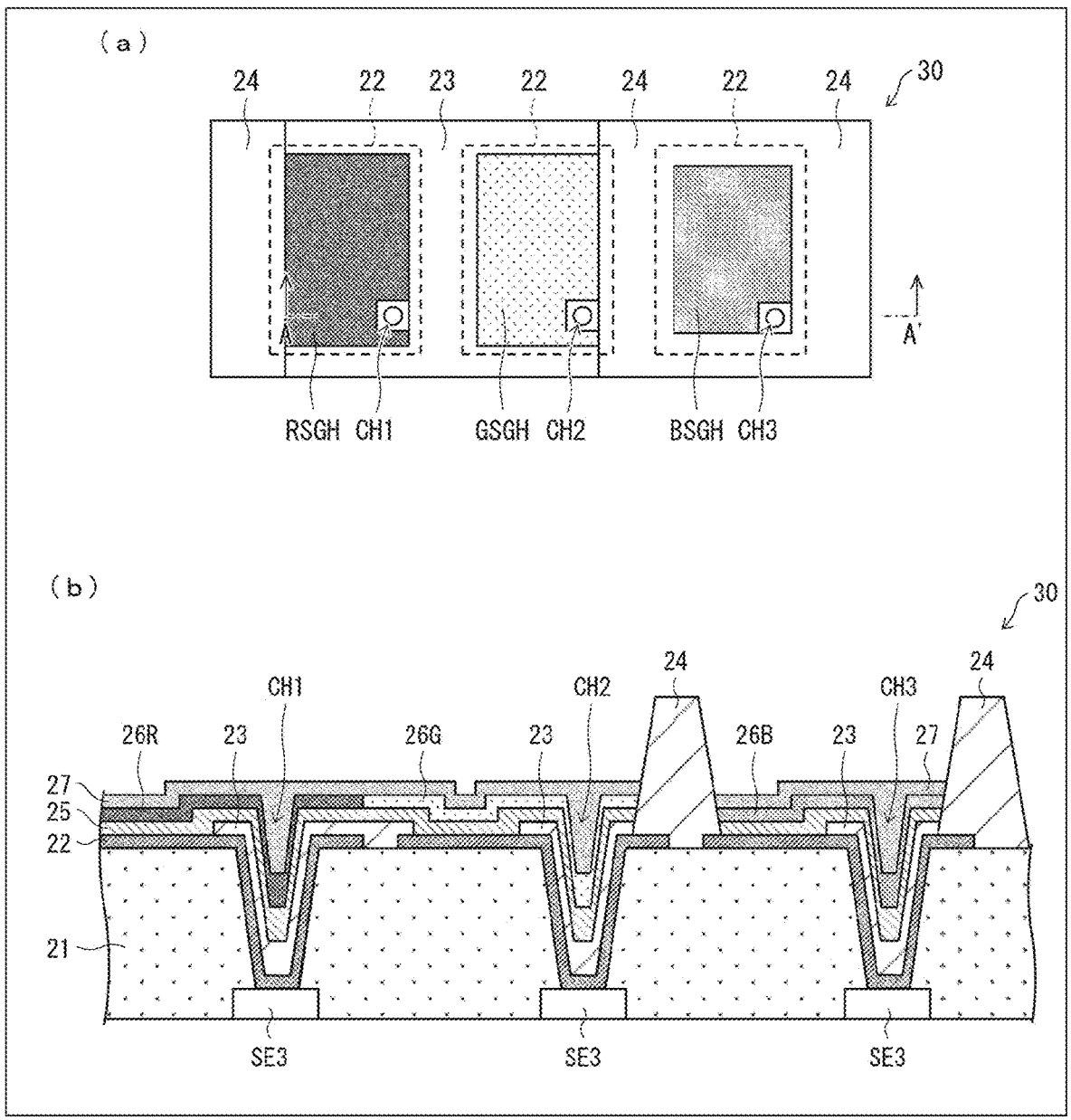
FIG. 3(a) is a plan view of one pixel included in the display device of the first embodiment.
FIG. 3(b) is a cross-sectional view of the display device of the first embodiment illustrated in FIG. 3(a) and taken along line A-A'.
Figure 4:
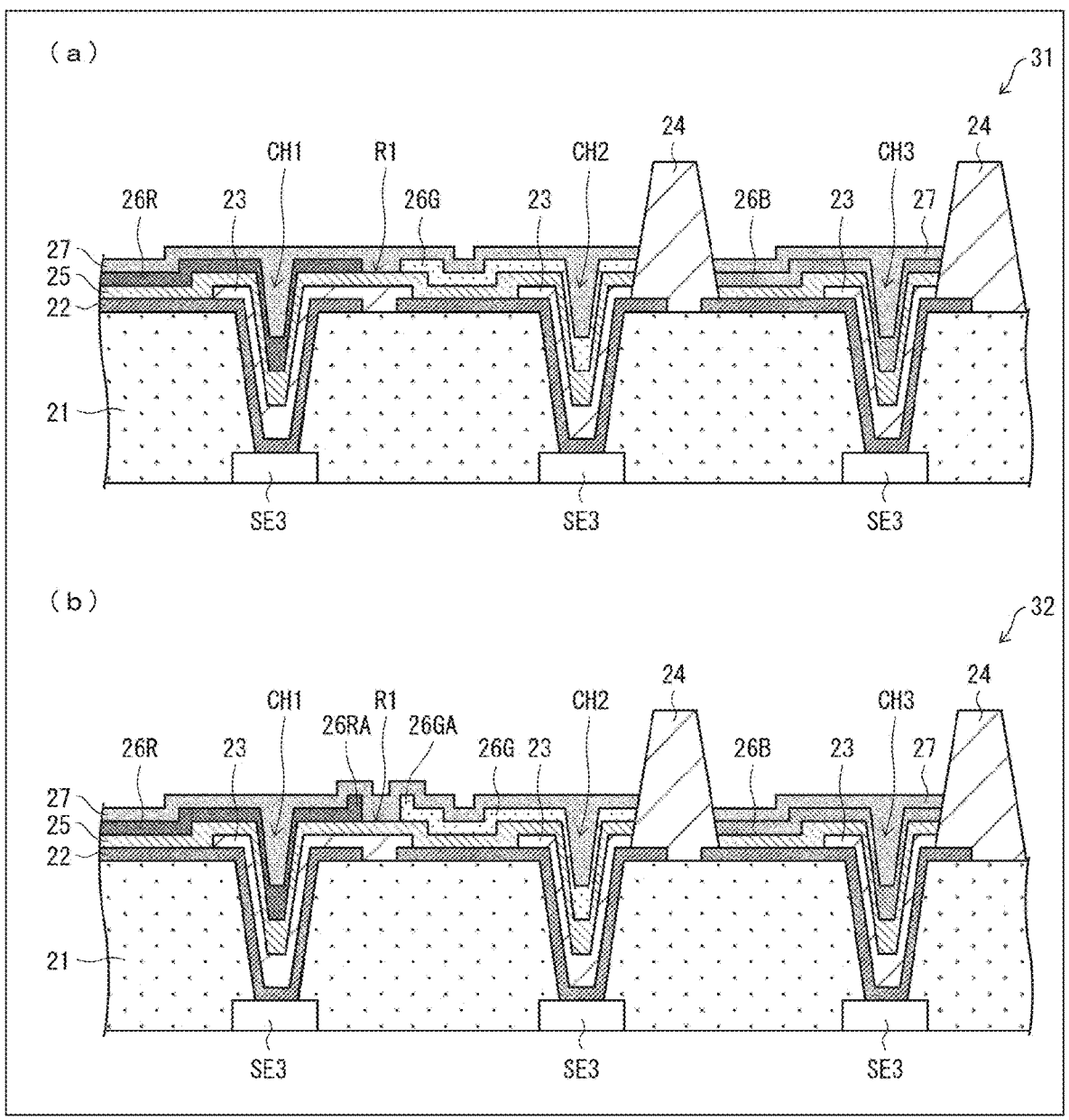
FIG. 4(a) is a view illustrating a first modification of the display device of the first embodiment.
FIG. 4(b) is a view illustrating a second modification of the display device of the first embodiment.
Figure 5:
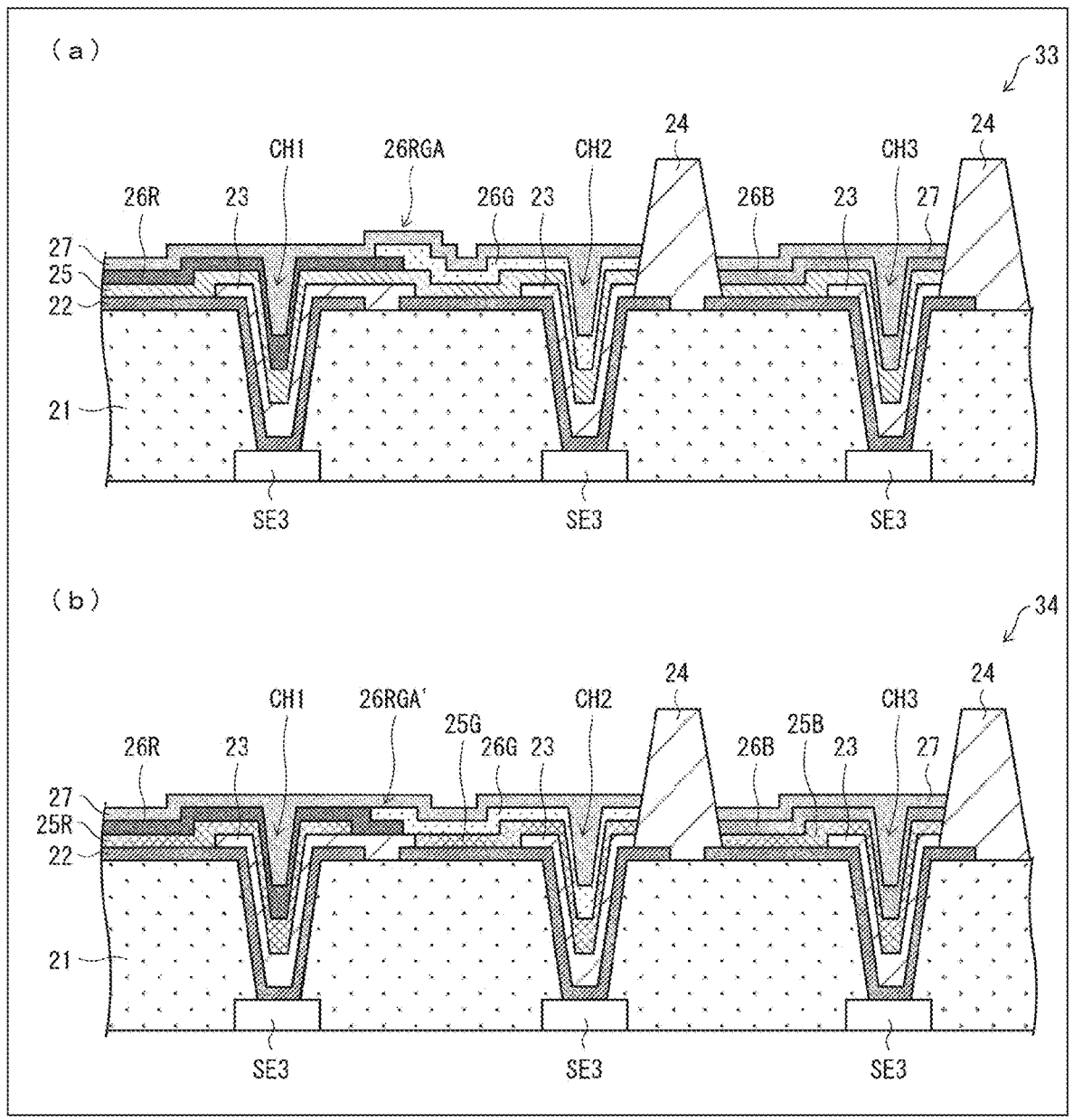
FIG. 5(a) is a view illustrating a third modification of the display device of the first embodiment.
FIG. 5(b) is a view illustrating a fourth modification of the display device of the first embodiment.
Figure 6:
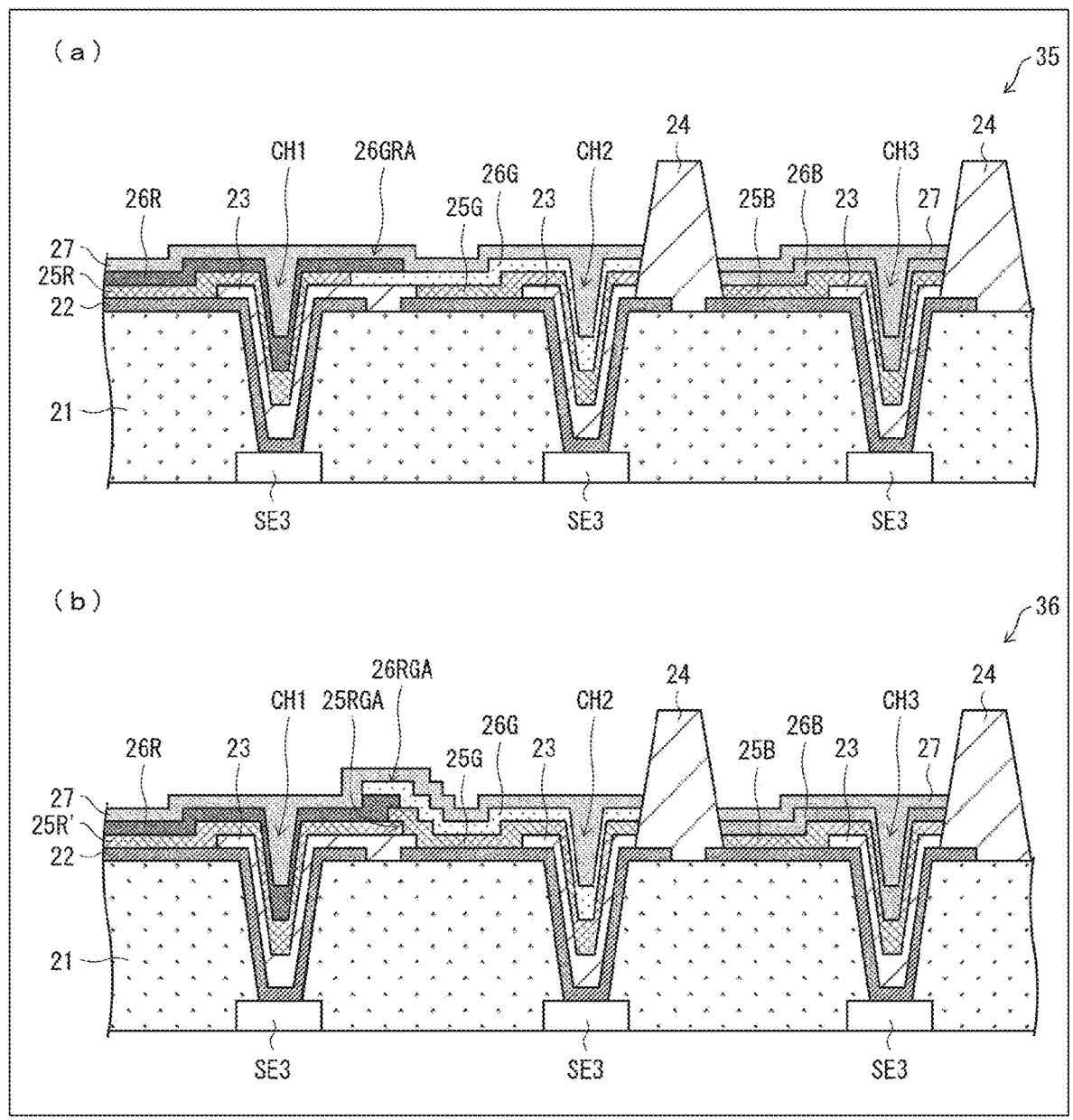
FIG. 6(a) is a view illustrating a fifth modification of the display device of the first embodiment.
FIG. 6(b) is a view illustrating a sixth modification of the display device of the first embodiment.
Figure 7:
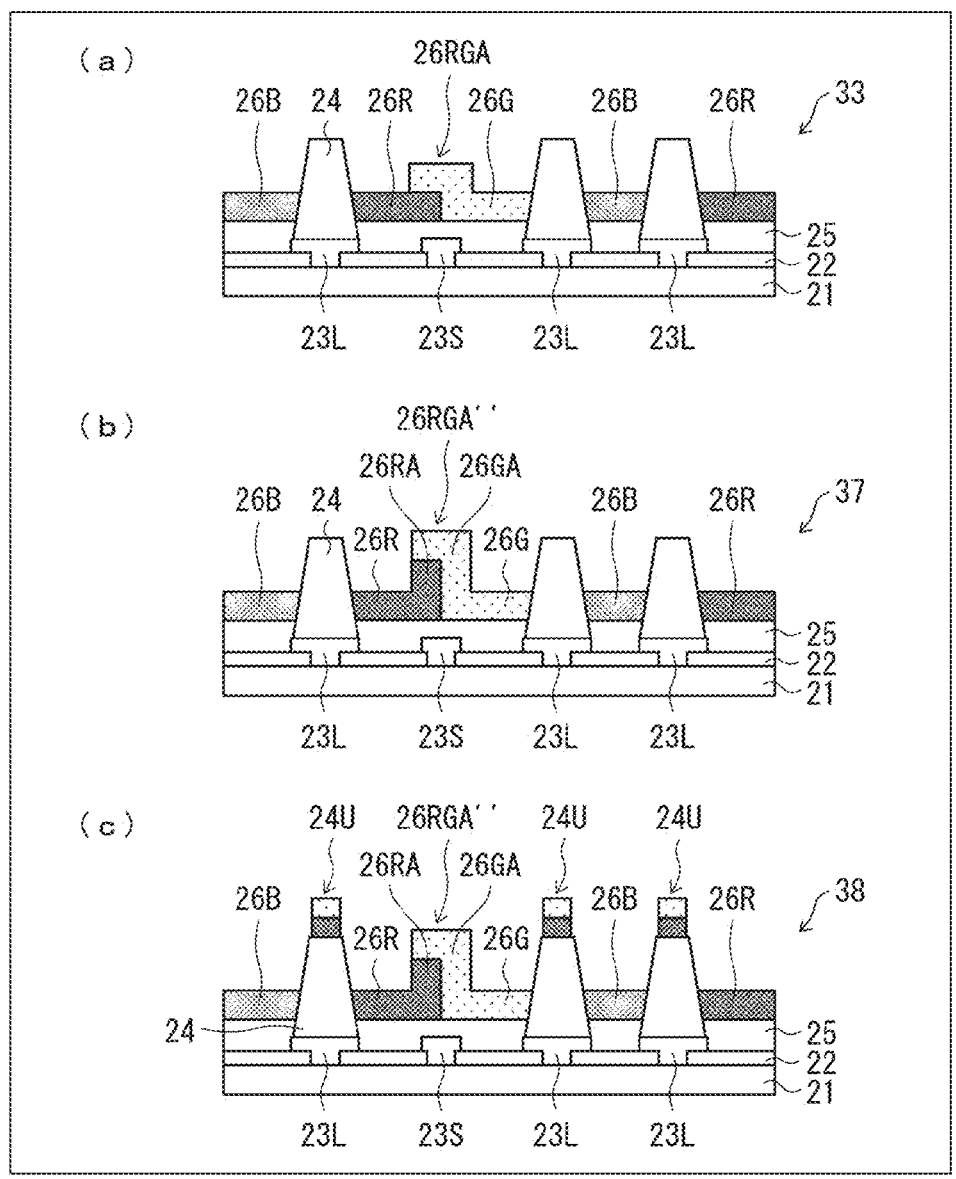
FIG. 7(a) is a view illustrating the third modification of the display device of the first embodiment in FIG. 5(a).
FIG. 7(b) is a view illustrating a seventh modification of the display device of the first embodiment.
FIG. 7(c) is a view illustrating an eighth modification of the display device of the first embodiment.
Figure 8:
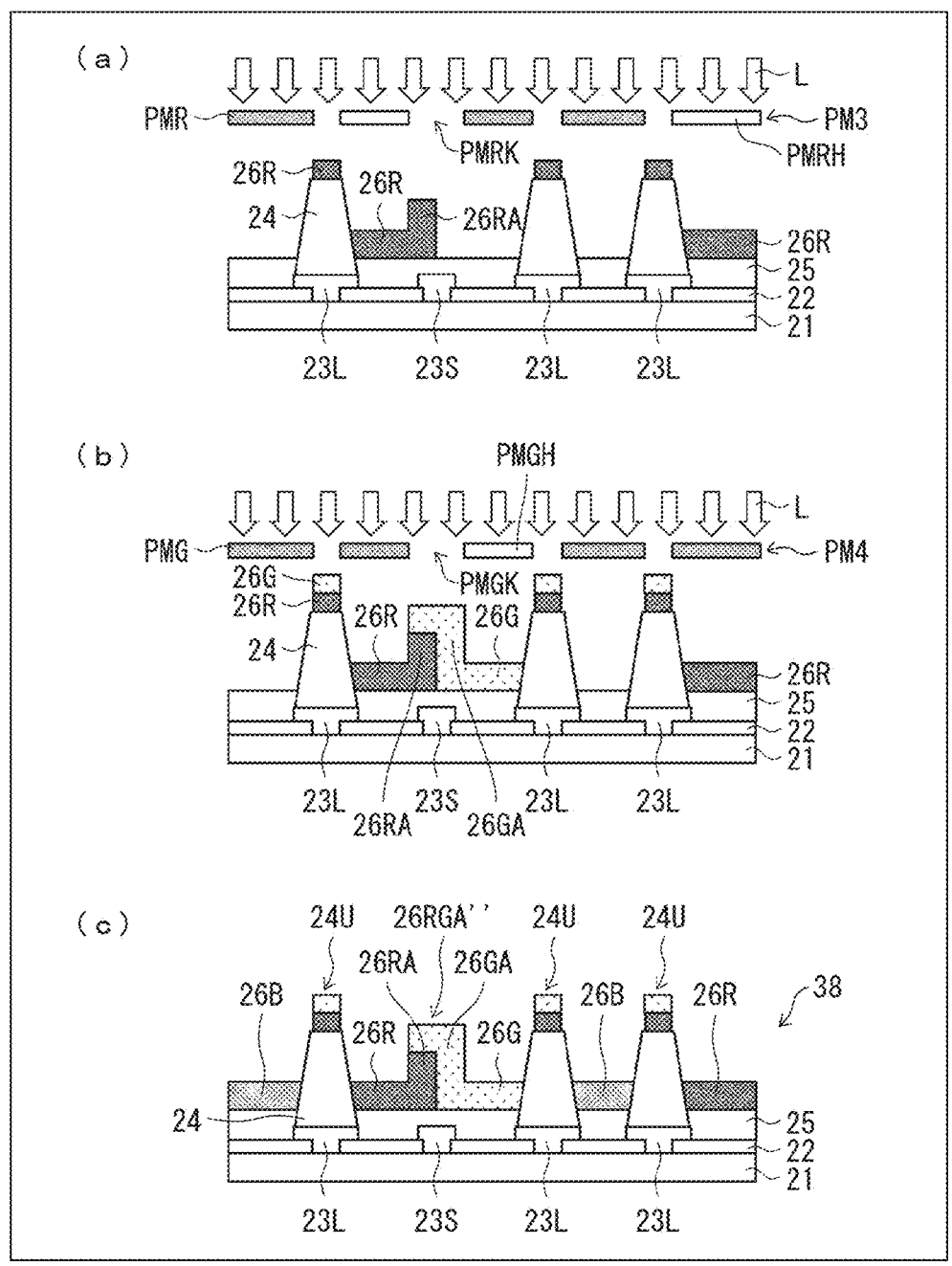
FIG. 8(a) to FIG. 8(c) are views partially illustrating steps of manufacturing the display device in FIG. 7(c) according to the eighth modification of the first embodiment.

FIG. 3 is a plan view of one pixel included in the display device 30 of the first embodiment. FIG. 3(b) is a cross-sectional view of the display device 30 of the first embodiment illustrated in FIG. 3(a) and taken along line A-A'.

As illustrated in FIG. 3(a), one pixel of the display device 30 includes three subpixels arranged side by side; namely, a red subpixel, a green subpixel, and a blue subpixel. Note that the first light-emitting layer 26R is formed to overlap in plan view with a first electrode 22 among the plurality of first electrodes 22. The second light-emitting layer 26B is formed to overlap in plan view with an other first electrode 22 among the plurality of first electrodes 22. The third light-emitting layer 26G is formed to overlap in plan view with still an other first electrode 22 among the plurality of first electrodes 22.

As to the display device 30, the first light-emitting layers 26R and the third light-emitting layers 26G are formed by photolithography, and it is unnecessary to provide banks 24 for forming the first light-emitting layers 26R and the third light-emitting layers 26G. Such a feature can reduce the total number of the banks 24. An edge cover 23 (23S), whose upper portion is not provided with a bank 24, can be formed relatively small in width such that the edge cover 23 (23S) and the first electrode 22 can overlap with each other in small area. If the edge cover 23 (23S) and the first electrode 22 overlap with each other in small area, the first electrode 22 and the functional layer 25 toward the first electrode 22 are in direct contact with each other in large area. Such a feature can increase a light-emitting region RSGH of the first light-emitting layer 26R and a light-emitting region GSGH of the third light-emitting layer 26G. Whereas, a light-emitting region BSGH of the second light-emitting layer 26B is smaller than the light-emitting region RSGH of the first light-emitting layer 26R and the light-emitting region GSGH of the third light-emitting layer 26G. This is because the edge cover 23 (23L), whose upper portion is provided with the bank 24, and the first electrode 22 overlap with each other in relatively large area, such that the first electrode 22 and the functional layer 25 toward the first electrode 22 are in direct contact with each other in small area.

As illustrated in FIG. 3(a) and FIG. 3(b), as to the display device 30 of this embodiment, the edge covers 23 are formed to cover contact holes CH1, CH2, and CH3 provided for the respective subpixels in different three colors. However, the edge covers 23 may be formed in any given manner.

As can be seen, in the display device 30, the light-emitting region RSGH of the first light-emitting layer 26R and the light-emitting region GSGH of the third light-emitting layer 26G are enlarged. Such a feature can reduce a rising voltage of, and increase the luminance of, the display device 30.

Moreover, as to the display device 30, the first light-emitting layers 26R and the third light-emitting layers 26G are formed by photolithography and the second light-emitting layers 26B are formed by inkjet printing. Compared with a case where all the light-emitting layers are formed by vapor deposition, such a feature can form the light-emitting layers efficiently.

Furthermore, as to the display device 30, the first light-emitting layers 26R and the third light-emitting layers 26G are formed in advance by photolithography, and the second light-emitting layers 26G are formed later by inkjet printing. Such a feature can reduce damage to the first light-emitting layers 26R and the third light-emitting layers 26G during the photolithography step. Specifically, after the first light-emitting layers 26R are formed, the photography step is carried out only once, and no photolithography step is carried out after the formation of the third light-emitting layers 26G. If the light-emitting layers in all the colors are formed by photolithography, the photolithography step is carried out at least twice after the light-emitting layers in the first color are formed first. Hence, the light-emitting layers suffer great damage at the photolithography step.

Moreover, in this embodiment, the inkjet material IJB for forming the second light-emitting-layers contains: the second quantum dots containing blue-light-emitting ligands that are low in carrier injection efficiency and EQE; and the solvent. Using such inkjet material DB, the second light-emitting layers 26B are made of the second quantum dots (the second light-emitting material) containing the ligands and formed by inkjet printing. The second light-emitting layers 26B, which are made of the second quantum dots (the second light-emitting material) containing the ligands, do not contain a composition to inhibit a flow of such carriers as a resin component contained in a resist material, unlike the first light-emitting layers 26R or the third light-emitting layers 26G. Such a feature can reduce a fall in luminance of light emitted from the second light-emitting layers 26B and a decrease in efficiency of the carrier injection in the second light-emitting layers 26B.

As can be seen, this embodiment exemplifies a case where the first light-emitting material contained in the first light-emitting layers 26R is the first quantum dots containing ligands, the second light-emitting material contained in the second light-emitting layers 26B is the second quantum dots containing ligands, and the third light-emitting material contained in the third light-emitting layers 26G is the third quantum dots containing ligands. However, this embodiment shall not be limited to such a case. For example, at least one of the first light-emitting material, the second light-emitting material, or the third light-emitting material may be quantum dots containing ligands, or none of the first light-emitting material, the second light-emitting material, or the third light-emitting material contains quantum dots containing ligands. An example of the light-emitting material not containing quantum dots includes an organic light-emitting material to be used for organic EL elements.

Moreover, this embodiment exemplifies a case where the second light-emitting layers 26B; namely, blue-light-emitting layers, are formed by inkjet printing. However, this embodiment shall not be limited to such a case. Either the first light-emitting layers 26R; namely, the red light-emitting layers or the third light-emitting layers 26G; namely, the green light-emitting layers may be formed by inkjet printing.

Furthermore, this embodiment exemplifies a case where the first light-emitting layers 26R; namely, the red light-emitting layers, are formed before the third light-emitting layers 26G; namely, the green light-emitting layers. However, this embodiment shall not be limited to such a case. The third light-emitting layers 26G; namely, the green light-emitting layers, may be formed before the first light-emitting layers 26R; namely, the red light-emitting layers.

Note that, this embodiment exemplifies a case where each pixel of the display device 30 includes three subpixels arranged side by side; that is, a red subpixel, a green subpixel, and a blue subpixel. However, this embodiment shall not be limited to such a case. Each pixel of the display device 30 may further include a subpixel in another color.

This embodiment exemplifies a case where the substrate 10 is a glass substrate as illustrated in FIG. 2. However, this embodiment shall not be limited to such a case. If the display device 30 is a flexible display device, the substrate 10 may be removed from the resin film 12 at a laser lift off step (LLO step) so that the display device 30 may be formed as a flexible display device. Moreover, after the substrate 10 is removed from the resin film 12 at the LLO step, a film may be attached to the resin film 12 through an adhesive layer so that the display device 30 may be formed as a flexible display device.

FIG. 4(a) is a view illustrating a display device 31 according to a first modification of the first embodiment. FIG. 4(b) is a view illustrating a display device 32 according to a second modification of the first embodiment. Note that FIG. 4(a) and FIG. 4(b) omit an illustration of the second electrodes 28.

As illustrated in FIG. 4(a), in the display device 31, the first light-emitting layer 26R and the third light-emitting layer 26G, both of which are formed by photolithography, are provided side by side. An end portion of the first light-emitting layer 26R and an end portion of the third light-emitting layer 26G are positioned across from each other and spaced apart from each other at a predetermined distance R1. For example, if the first light-emitting layer 26R and the third light-emitting layer 26G positioned side by side are formed so close to be in contact with each other, the third light-emitting layer 26G might unintentionally emit light when the first light-emitting layer 26R emits light, and the first light-emitting light 26R might unintentionally emit light when the third light-emitting layer 26G emits light.

As to the display device 31, an end portion of the first light-emitting layer 26R and an end portion of the third light-emitting layer 26G are positioned across from each other and spaced apart at the predetermined distance R1. Such a feature can reduce unintentional emission of light from unintentional light-emitting layers positioned side by side.

As illustrated in FIG. 4(b), in the display device 32, the first light-emitting layer 26R formed by photolithography has an end portion 26RA formed thicker than any other portion of the first light-emitting layer 26R. The third light-emitting layer 26G formed by photolithography has an end portion 26GA formed thicker than any other portion of the first light-emitting layer 26G. Typically, a light-emitting layer formed by photolithography has a tapered end portion. The tapered end portion is thin, and might cause concentration of electric currents.

As to the display device 32, the end portion 26RA of the first light-emitting layer 26R is formed thicker than any other portion of the first light-emitting layer 26R, and the end portion 26GA of the third light-emitting layer 26G is formed thicker than any other portion of the third light-emitting layer 26G. Such a feature can reduce a possible risk of concentration of currents at the edge portions of the first light-emitting layer 26R and the third light-emitting layer 26G.

Note that the end portion 26RA of the first light-emitting layer 26R and the end portion 26GA of the third light-emitting layer 26G can be formed by exposure to light, using a mask (e.g., a half-tone mask or a shadow mask) for controlling the amount of light on an exposure region.

FIG. 5(a) is a view illustrating a display device 33 according to a third modification of the first embodiment. FIG. 5(b) is a view illustrating a display device 34 according to a fourth modification of the first embodiment. Note that FIG. 5(a) and FIG. 5(b) omit an illustration of the second electrodes 28.

As illustrated in FIG. 5(a), the display device 33 is provided with a first thick portion 26RGA including: a portion of an edge of the first light-emitting layer 26R that is formed by photolithography; and a portion of an edge of the third light-emitting layer 26G that is formed by photolithography, the portions being in contact with, and overlapping with, each other. The first thick portion 26RGA overlaps with at least a portion between a first electrode 22 overlapping with the first light-emitting layer 26R and a first electrode 22 overlapping with the third light-emitting layer 26G.

The first thick portion 26RGA is high in resistance and low in electrical conductivity. Hence, the first thick portion 26RGA can reduce mixture of colors between the first light-emitting layer 26R and the third light-emitting layer 26G. Moreover, the first thick portion 26RGA can reduce concentration of currents at an edge portion of a first electrode 22.

Note that the first thick portion 26RGA can be formed, for example, as follows. First, the first light-emitting layer 26R is formed by photolithography. After that, in exposure to light at the step of forming the third light-emitting layer 26G by photolithography, a region included in the third light-emitting layer 26G and overlapping with the first light-emitting layer 26R is also exposed to the light to form the first thick portion 26RGA.

As to the display devices 30, 31, 32, and 33, the functional layer 25 is provided in common among all the subpixels toward the first electrodes 22. As to the display device 34 illustrated in FIG. 5(b), functional layers 25R, 25G, and 25B are provided, toward the first electrodes 22, to the respective subpixels in different three colors. Each of the functional layers 25R, 25G, and 25B toward the first electrodes 22 may be, for example, formed of a single material at a single photolithography step, or formed of three different materials at three photolithography steps.

The display device 34 is provided with a first thick portion 26RGA'. The first thick portion 26RGA' is high in resistance and low in electrical conductivity. Hence, the first thick portion 26RGA' can reduce mixture of colors between the first light-emitting layer 26R and the third light-emitting layer 26G. Moreover, the first thick portion 26RGA' can reduce concentration of currents at an edge portion of a first electrode 22.

FIG. 6(a) is a view illustrating a display device 35 according to a fifth modification of the first embodiment. FIG. 6(b) is a view illustrating a display device 36 according to a sixth modification of the first embodiment. Note that FIG. 6(a) and FIG. 6(b) omit an illustration of the second electrodes 28.

The display device 35 illustrated in FIG. 6(a) is provided with a first thick portion 26GRA. Note that the first thick portion 26RGA can be formed as follows. First, the third light-emitting layer 26G is formed by photolithography. After that, in exposure to light at the step of forming the first light-emitting layer 26R by photolithography, a region included in the first light-emitting layer 26R and overlapping with the third light-emitting layer 26G is also exposed to the light to form the first thick portion 26GRA.

The display device 35 is provided with the first thick portion 26GRA. The first thick portion 26GRA is high in resistance and low in electrical conductivity. Hence, the first thick portion 26GRA can reduce mixture of colors between the first light-emitting layer 26R and the third light-emitting layer 26G. Moreover, the first thick portion 26GRA can reduce concentration of currents at an edge portion of a first electrode 22.

A display device 36 illustrated in FIG. 6(b) includes: a functional layer 25R' provided toward the first electrodes 22 and overlapping with the first light-emitting layer 26R; a functional layer 25G provided toward the first electrodes 22 and overlapping with the third light-emitting layer 26G; and a functional layer 25B provided toward the first electrodes 22 and overlapping with the second light-emitting layer 26B. The functional layers 25R', 25G, and 25B are provided to the respective subpixels in different three colors.

The display device 36 is provided with the first thick portion 26RGA illustrated in FIG. 5(a), and further provided with a second thick portion 25RGA. The second thick portion 25RGA includes: a portion of an edge of the functional layer (a first functional layer) 25R' provided toward the first electrodes 22 and overlapping with the first light-emitting layer 26R; and a portion of an edge of the functional layer (a second functional layer) 25G provided toward the first electrodes 22 and overlapping with the third light-emitting layer 26G, the portions being in contact with, and overlapping with, each other. Note that the second thick portion 25RGA overlaps with at least a portion between a first electrode 22 overlapping with the first light-emitting layer 26R and a first electrode 22 overlapping with the third light-emitting layer 26G.

The second thick portion 25RGA can be formed, for example, as follows. First, the functional layer (the first functional layer) 25R' is formed toward the first electrodes 22 by photolithography. After that, in exposure to light at the step of forming the functional layer (the second functional layer) 25G toward the first electrodes 22 by photolithography, a region included in the functional layer (the second functional layer) 25G toward the first electrodes 22 and overlapping with the functional layer (the first functional layer) 25R' toward the first electrodes 22 is also exposed to the fight to form the first thick portion 25RGA.

The display device 36 is provided with the second thick portion 26RGA. The second thick portion 25RGA is high in resistance and low in electrical conductivity. Hence, the second thick portion 25RGA can reduce mixture of colors between the first light-emitting layer 26R and the third light-emitting layer 26G. Moreover, the second thick portion 25RGA can reduce concentration of currents at an edge portion of a first electrode 22.

This embodiment exemplifies a case where the display device 36 is provided with the second thick portion 25RGA. The second thick portion 25RGA includes: a portion of an edge of the functional layer (the first functional layer) 25R' provided toward the first electrodes 22; and a portion of an edge of the functional layer (the second functional layer) 25G provided toward the first electrodes 22 and overlapping with the third light-emitting layer 26G, the portions being in contact with, and overlapping with, each other to form the second thick portion 25RGA. However, the second thick portion 25RGA shall not be limited to such an example. For example, the second thick portion may be formed as follows. The functional layers 27 toward the second electrodes 28 are provided for the respective subpixels in different three colors. A portion of an edge of a functional layer (the first functional layer) provided toward the second electrodes 28 and overlapping with the first light-emitting layer 26R and a portion of an edge of a functional layer (the second functional layer) provided toward the second electrodes 28 and overlapping with the third light-emitting layer 26G are formed in contact with, and overlapping with, each other to form the second thick portion.

FIG. 7(a) is a view illustrating the display device 33 in FIG. 5(a) according to the third modification of the first embodiment. FIG. 7(b) is a view illustrating a display device 37 according to a seventh modification of the first embodiment. FIG. 7(c) is a view illustrating a display device 38 according to an eighth modification of the first embodiment. Note that FIG. 7(a), FIG. 7(h), and FIG. 7(c) omit illustrations of the second electrodes 28 and the functional layers 27 toward the second electrodes 28.

The display device 37 illustrated in FIG. 7(b) is provided with a first thick portion 26RGA". The first thick portion 26RGA" is thicker than the first thick portion 26RGA included in the display device 33 illustrated in FIG. 7(a).

The first thick portion 26RGA" can be formed, for example, as follows. First, the first light-emitting layer 26R is formed by photolithography so that the end portion 26RA of the first light-emitting layer 26R is thicker than any other portion of the first light-emitting layer 26R. After that, in exposure to light at the step of forming the third light-emitting layer 26G by photolithography, a region included the third light-emitting layer 26G and overlapping with the end portion 26RA of the first light-emitting layer 26R is also exposed to the light to form the first thick portion 26RGA". Note that, at the step of forming the third light-emitting layer 26G the end portion 26GA of the third light-emitting layer 26G is formed thicker than any other portion of the third light-emitting layer 26G. The first thick portion 26RGA" includes the end portion 26RA of the first light-emitting layer 26R and the end portion 26GA of the third light-emitting layer 26G.

The first thick portion 26RGA" is high in resistance and low in electrical conductivity. Hence, the first thick portion 26RGA" can reduce mixture of colors between the first light-emitting layer 26R and the third light-emitting layer 26G. Moreover, the first thick portion 26RGA" can reduce concentration of currents at an edge portion of a first electrode 22.

The display device 38 illustrated in FIG. 7(c) includes upper banks 24U on the banks 24. Each of the upper banks 24U is provided with: a same layer made of the same material as the material of the first light-emitting layer 26R; and a same layer made of the same material as the material of the third light-emitting layer 26G.

This embodiment exemplifies a case where the upper bank 24U is formed of two layers one of which is the same layer made of the same material as the material of the first light-emitting layer 26R, and another one of which is the same layer made of the same material as the material of the third light-emitting layer 26G. However, this embodiment shall not be limited to such a case. The upper bank 24U may be at least one of: the same layer formed of the same material as the material of the first light-emitting layer 26R; or the same layer formed of the same material as the material of the third light-emitting layer 26G.

The upper bank 24U on the bank 24 can increase a height of the bank and obtain an advantageous effect of absorbing outside light.

FIG. 8(a) to FIG. 8(c) are views partially illustrating steps of manufacturing the display device 38 in FIG. 7(c) according to the eighth modification of the first embodiment. Note that FIG. 8(c) omits illustrations of the second electrodes 28 and the functional layers 27 toward the second electrodes 28.

FIG. 8(a) shows the following case. The resist material 26RO formed thoroughly is exposed to light, using a photomask PM3 including: the opening portions PMRK that allow the exposure light L to pass through; the light-blocking portions PMR that block the exposure light L; and half-tone portions (shadow portions) PMRH that allow the exposure light L to pass through less than the opening portions PMRK do and more than the light-blocking portions PMR do. After that, the resist material 26RO is developed and treated with heat, such that a first light-emitting layer 26R is formed in a predetermined region (the first region). The first light-emitting layer 26R includes the end portion 26RA formed thicker than any other portion of the first light-emitting layer 26R. Moreover, on each of the banks 24, the first light-emitting layer 26R is formed to form the upper bank 24U.

FIG. 8(b) shows the following case. The resist material 26GO formed thoroughly is exposed to light, using a photomask PM4 including: the opening portions PMGK that allow the exposure light L to pass through; the light-blocking portions PMG that block the exposure light L; and a half-tone portion (a shadow portion) PMGH that allows the exposure light L to pass through less than the opening portions PMGK do and more than the light-blocking portions PMG do. After that, the resist material 26GO is developed and treated with heat, such that a third light-emitting layer 26G is formed in a predetermined region (the third region). The third light-emitting layer 26G includes the end portion 26GA formed thicker than any other portion of the third light-emitting layer 26G. Moreover, on each of the banks 24, the third light-emitting layer 26G is formed to form the upper bank 24U. Note that, to form the first thick portion 26RGA" illustrated in FIG. 8(c), in exposure to light at the step of forming the third light-emitting layer 26G, a region included in the third light-emitting layer 26G and overlapping with the end portion 26RA of the first light-emitting layer 26R is also exposed to the light.

As can be seen in FIG. 8(c), the display device 38 can be manufactured to include the first thick portion 26RGA" and the upper banks 24U.

Second Embodiment

Figure 9:
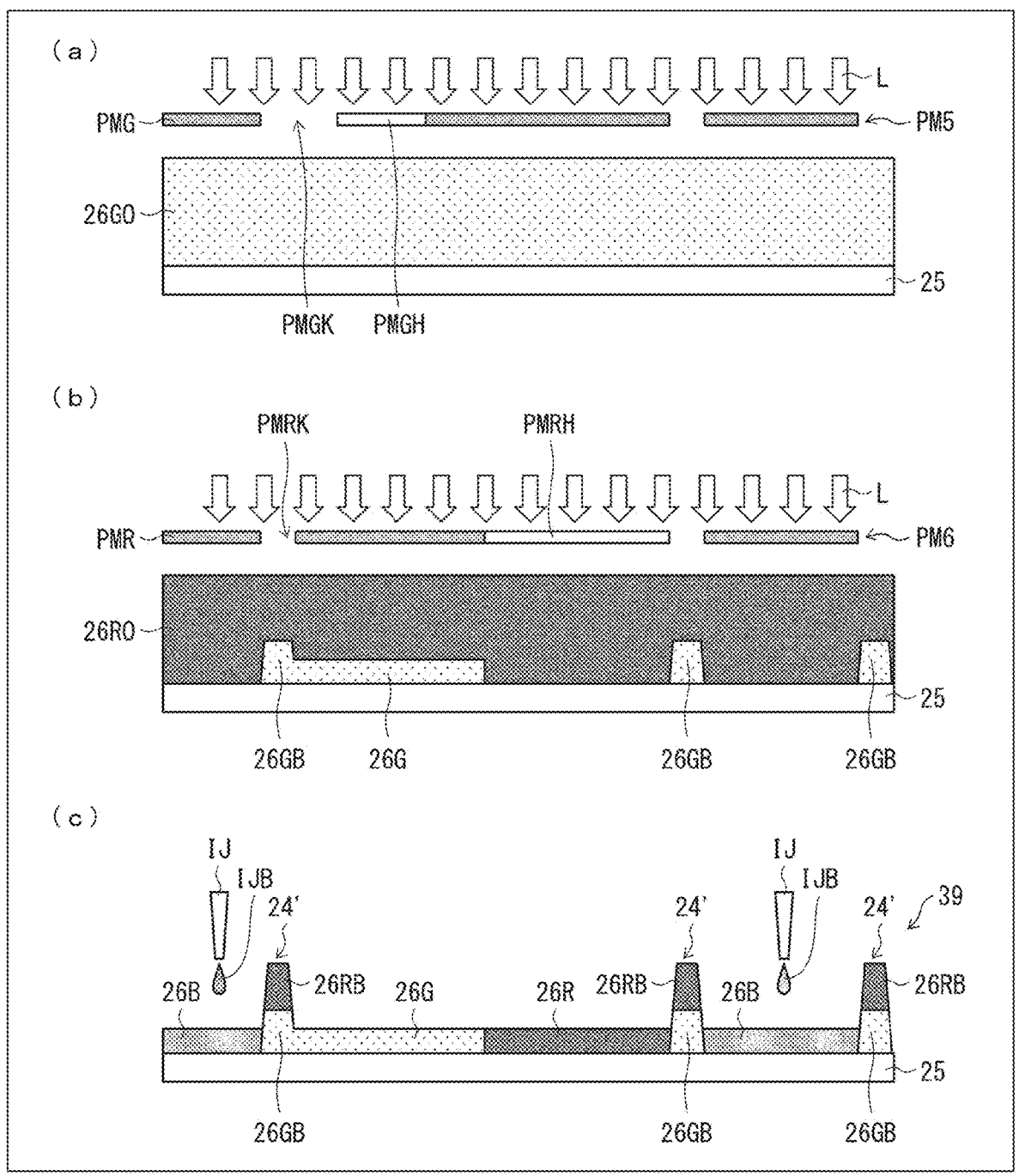
FIG. 9(a) to FIG. 9(c) are views partially illustrating steps of manufacturing a display device of a second embodiment.
Figure 10:
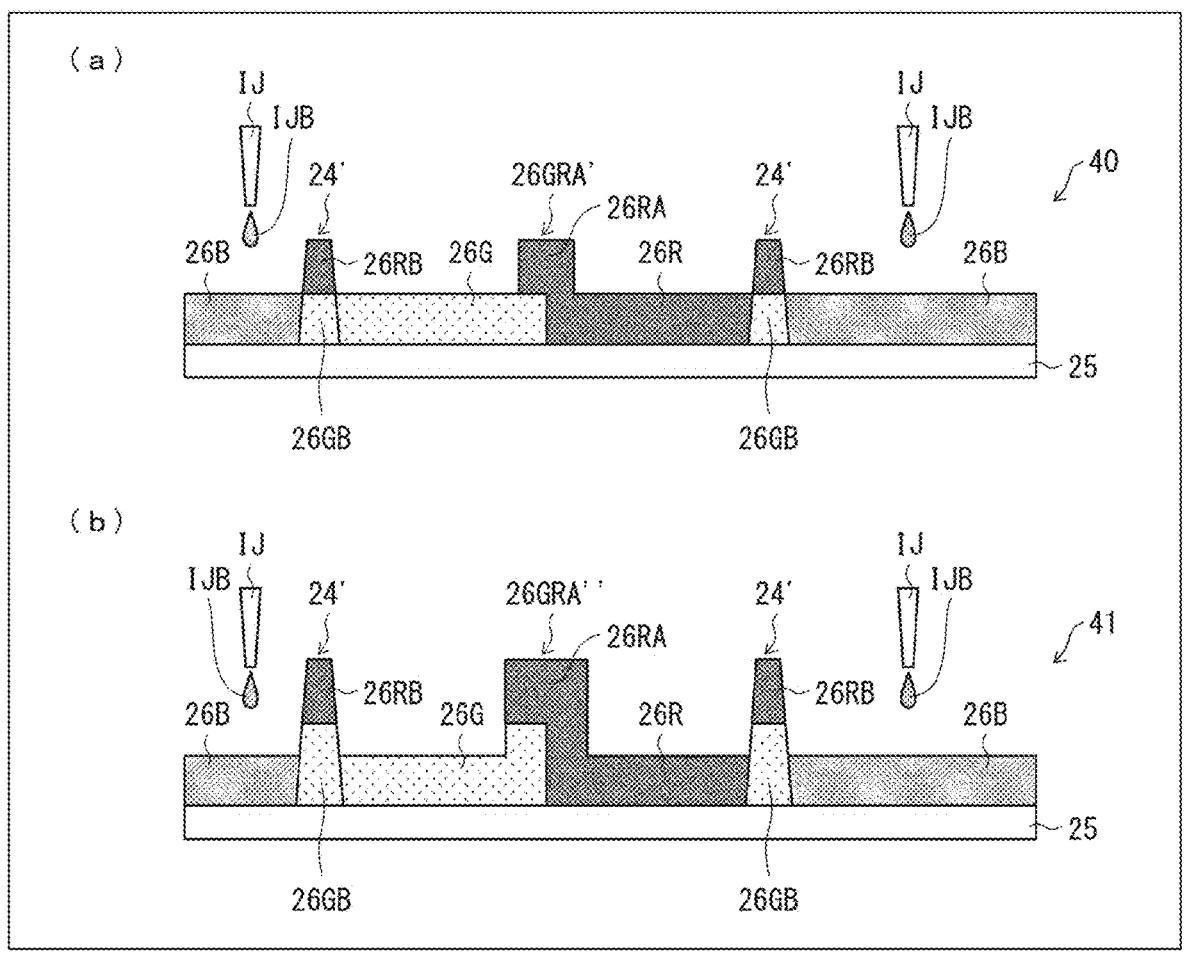
FIG. 10(a) is a view illustrating a first modification of the display device of the second embodiment.
FIG. 10(b) is a view illustrating a second modification of the display device of the second embodiment.

Next, with reference to FIGS. 9 and 10, a second embodiment of the disclosure is described. Display devices 39, 40, and 41 of this embodiment are different from the display devices of the first embodiment in that, as to the display devices 39, 40, and 41, a bank 24' is formed of at least one of a same layer 26RB formed of the same material as the material of the first light-emitting layer 26R or a same layer 26GB formed of the same material as the material of the third light-emitting layer 26G. Otherwise, the display devices 39, 40, and 41 are the same as the display devices of the first embodiment. For the sake of description, like reference signs designate identical or corresponding constituent features between the drawings of this embodiment and the first embodiment. These constituent features will not be elaborated upon.

FIG. 9(a) to FIG. 9(c) are views partially illustrating steps of manufacturing the display device 39 of the second embodiment. Note that 9(c) omits illustrations of the second electrodes 28 and the functional layers 27 toward the second electrodes 28.

FIG. 9(a) shows a step at which the resist material 26GO formed thoroughly is exposed to light, using a photomask PM5 including: the opening portions PMGK that allow the exposure light 1, to pass through; the light-blocking portions PMG that block the exposure light L; and a half-tone portion (a shadow portion) PMGH that allows the exposure light L to pass through less than the opening portions PMGK do and more than the light-blocking portions PMG do. After the exposure, the resist material 26GO is developed and treated with heat, such that, as illustrated in FIG. 9(b), a third light-emitting layer 26G and the same layer 26GB are formed in a predetermined region (the third region). The same layer 26GB is formed of the same material as the material of the third light-emitting layer 26G, and forms a portion of the bank 24' formed thicker than the third light-emitting layer 26G.

FIG. 9(b) shows a step at which the resist material 26RO formed thoroughly is exposed to light; using a photomask PM6 including: the opening portions PMRK that allow the exposure light L to pass through; the light-blocking portions PMR that block the exposure light L; and the half-tone portion (tile shadow portion) PMRH that allows the exposure light L to pass through less than the opening portions PMRK do and more than the light-blocking portions PMR do. After the exposure, the resist material 26RO is developed and treated with heat, such that, as illustrated in FIG. 9(c), a third light-emitting layer 26R and the same layer 26RB are formed in a predetermined region (the first region). The same layer 26RB is formed of the same material as the material of the first light-emitting layer 26R, and forms a portion of the bank 24' formed thicker than the first light-emitting layer 26R.

FIG. 9(c) shows a step of forming a second light-emitting layer 26B only in a predetermined region (the second region). The step is carried out after the steps of forming the third light-emitting layer 26G and the first light-emitting layer 26R. The inkjet material LIB for forming the second light-emitting layers is delivered with the inkjet apparatus U in droplets behind the banks 24' shaped into a picture frame to surround the predetermined region (the second region). The inkjet material IJB contains the second quantum dots (the second light-emitting material) containing ligands emitting a blue light, and a solvent. Note that the first light-emitting layer 26R and the third light-emitting layer 26G are formed out of the banks 24' formed in a shape of a picture frame.

After that, the inkjet material LIB is treated with heat for a predetermined time period at a temperature of, for example, 50 degrees or higher and 200 degrees or lower, so that the solvent evaporates. Hence, the second light-emitting layers 26B, which are made of the second quantum dots (the second light-emitting material) containing the ligands, are formed in contact with inner side faces of the banks 24'. The second light-emitting layers 26B have a thickness of 1 nm or more and 100 nm or less.

As to the display device 39 illustrated in FIG. 9(*c*), each of the banks 24' is formed of: the same layer 26RB made of the same material as the material of the first light-emitting layer 26R; and the same layer 26GB made of the same material as the material of the third light-emitting layer 26G. Hence, another material does not have to be used for forming the banks 24' Such a feature can reduce the manufacturing steps and the material costs. Moreover, each bank 24' is formed of two layers: the same layer 26RB formed of the same material as the material of the first light-emitting layer 26R and the same layer 26GB formed of the same material as the material of the third light-emitting layer 26G. Hence, the bank can be formed tall.

Note that this embodiment exemplifies a case where the bank 24' is formed of: the same layer 26RB formed of the same material as the material of the first light-emitting layer 26R; and the same layer 26GB formed of the same material as the material of the third light-emitting layer 26G. However, this embodiment shall not be limited to such a case. The bank 24' may be formed of at least one of: the same layer 26RB formed of the same material as the material of the first light-emitting layer 26R; or the same layer 2603 formed of the same material as the material of the third light-emitting layer 26G.

FIG. 10(*a*) is a view illustrating a display device 40 according to a first modification of the second embodiment. FIG. 10(*b*) is a view illustrating a display device 41 according to a second modification of the second embodiment. Note that FIG. 10(*a*) and FIG. 10(*b*) omit illustrations of the second electrodes 28 and the functional layers 27 toward the second electrodes 28.

The display device 40 illustrated in FIG. 10(*a*) includes the banks 24' each formed of the same layer 26RB formed of the same material as the material of the first light-emitting layer 26R and the same layer 26GB formed of the same material as the material of the third light-emitting layer 26G. The display device 40 father includes the first thick portion 26GRA' described in the first embodiment.

The display device 41 illustrated in FIG. 10(*b*) includes the banks 24' each formed of the same layer 26RB formed of the same material as the material of the first light-emitting layer 26R and the same layer 26GB formed of the same material as the material of the third light-emitting layer 26G. The display device 41 father includes the first thick portion 26GRA" described in the first embodiment.

Note that each of the first thick portion 26GRA' illustrated in FIG. 10(*a*) and the first thick portion 26GRA" illustrated in FIG. 10(*b*) is not shaped into a picture frame. Hence, even if the first thick portions 26GRA' and 26GRA" are provided to the display devices 40 and 41, the first light-emitting layer 26R and the third light-emitting layer 26G can have large light-emitting regions.

Third Embodiment

Figure 11:
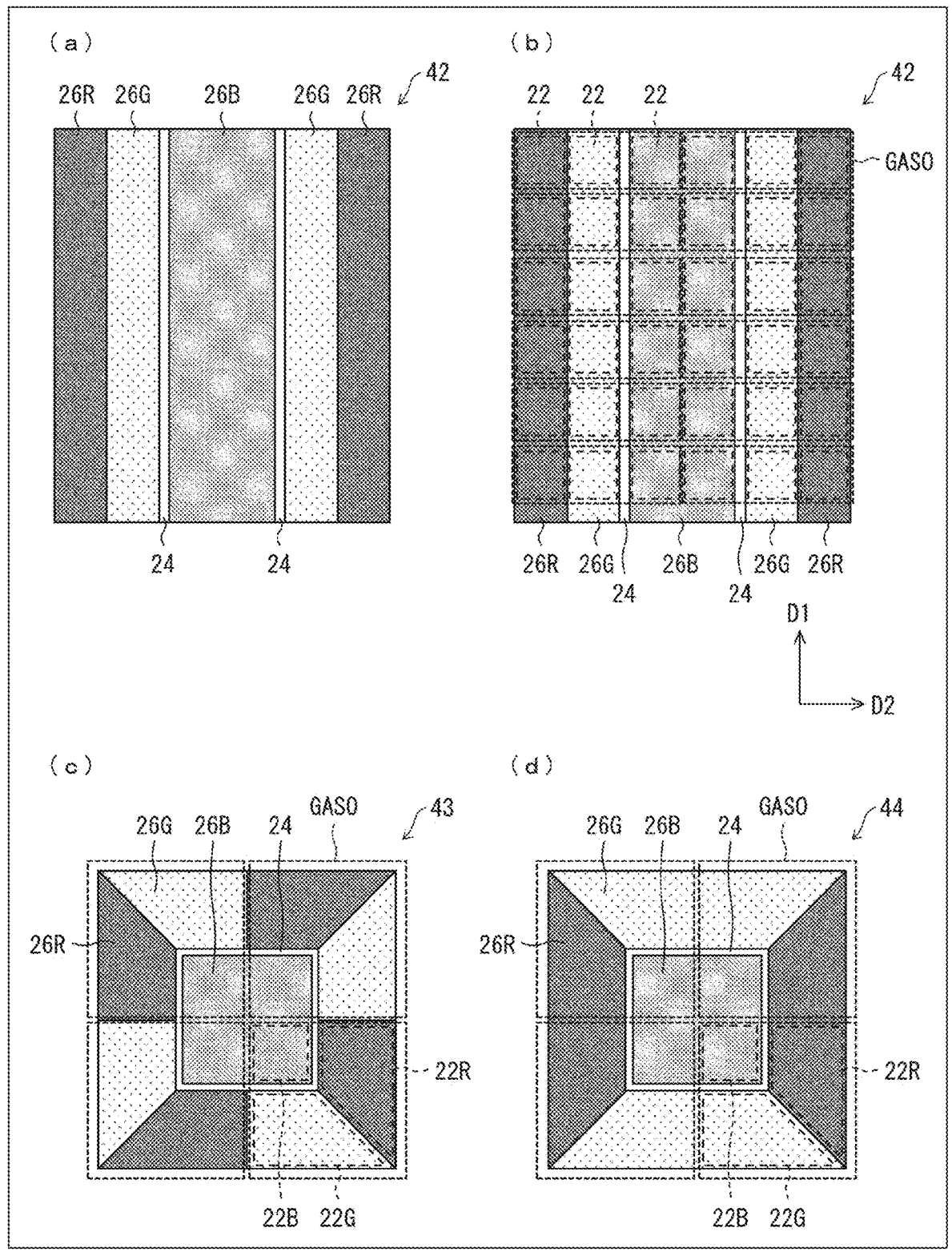
FIG. 11(a) and FIG. 11(b) are views illustrating a schematic configuration of a display device of a third embodiment.
FIG. 11(c) is a view illustrating a first modification of the display device of the third embodiment.
FIG. 11(d) is a view illustrating a second modification of the display device of the third embodiment.

Next, with reference to FIG. 11, a third embodiment of the disclosure is described. Display devices 42, 43, and 44 of this embodiment are different from the display devices of the first and second embodiments in that, as to the display devices 42, 43, and 44, arears in which the banks 24 are formed are reduced so that light emitting areas of the first light-emitting layers 26R, the second light-emitting layer 26B, and the third light-emitting layers 26G are enlarged. Otherwise, the display devices 42, 43, and 44 are the same as the display devices described in the first and second embodiments. For the sake of description, like reference signs designate identical or corresponding constituent features between the drawings of this embodiment and the first and second embodiments. These constituent features will not be elaborated upon.

FIG. 11(*a*) and FIG. 11(*b*) are views illustrating a schematic configuration of the display device 42 of the third embodiment, FIG. 11(*c*) is a view illustrating the display device 43 according to a first modification of the third embodiment. FIG. 11(*d*) is a view illustrating the display device 44 according to a second modification of the third embodiment.

As illustrated in FIG. 11(*a*) and FIG. 11(*b*), the display device 42 includes the plurality of first electrodes 22 arranged in a matrix. Each of the first light-emitting layers 26R and the third light-emitting layers 26G overlaps with, for example, a single-column first electrode group in which the first electrodes 22 are arranged in a first direction D1. The second light-emitting layer 26B is shaped into a line by inkjet printing, and overlaps with, for example, a double-column first electrode groups in which the first electrodes 22 are arranged in the first direction D1. In a second direction D2 perpendicular to the first direction D1, two first electrodes 22 overlapping with the second light-emitting layer 26B each belong to different pixels GASO. Note that a pixel GASO includes, for example, three first electrodes 22 arranged side by side in the second direction D2 and overlapping with different light-emitting layers.

As to the first and second embodiments, the banks 24 and 24' are each shaped into a picture frame for the respective subpixels. However, as to the display device 42, the bank 24 includes two partition walls facing each other. The bank 24 encloses a left side and a right side of the second light-emitting layer 26B shaped into a line by inkjet printing. That is, as illustrated in FIG. 11(*a*), the bank 24 includes two partition walls facing each other, and separating an inner region from an outer region. The second light-emitting layer 26B is formed in the inner region behind the two facing partition walls, and the first light-emitting layers 26R and the third light-emitting layers 26G are formed in the outer region out of the two facing partition walls. Such a feature can reduce an area for forming the bank 24, and increase the light-emitting areas of the first light-emitting layers 26R, the second light-emitting layer 26B, and the third light-emitting layers 26G.

Note that, at a step of forming the first light-emitting layers 26R, the second light-emitting layer 26B, and the third light-emitting layers 26G on a large substrate, before obtaining a display device 42 in the form of a divided piece illustrated in FIG. 11(*a*) and FIG. 11(*b*), the bank 24 may be either formed in a shape of a picture frame or formed to include two partition walls facing each other and separating the inner region from the outer region. The large substrate is sufficiently large so that multiple display devices 42 can be obtained by division.

If the banks 24 are formed on a large substrate and each shaped into a picture frame for a size of a display device 42, at a step of dividing the substrate into pieces, for example, an upper side and a lower side of each bank 24 shaped into a picture frame may be cut off, and, as the display device 42 divided into a piece as illustrated in FIG. 11(*a*) and FIG. 11(*b*), the bank 24 may include two partition walls facing each other and separating the inner region from the outer region. The step of dividing shall not be limited to such an example. At the step of dividing, either the upper side or the lower side of the bank 24 shaped into a picture frame may be cut off. Alternatively, neither the upper side nor the lower side of the bank 24 shaped into a picture frame may be cut off.

Moreover, if the banks 24 are formed on a large substrate, and each shaped into a picture frame sized across a plurality of display devices 42, or if the banks 24 are each formed to include two partition walls facing each other and separating an inner region from an outer region both sized across a plurality of display devices 42, the large substrate may be divided into pieces at the step of dividing, and, as the display device 42 divided into a piece as illustrated in FIG. 11(a) and FIG. 11(b), the bank 24 may include two partition walls facing each other and separating the inner region from the outer region.

As illustrated in FIG. 11(c), as to the display device 43, the first light-emitting layers 26R and the third light-emitting layers 26G formed by photolithography are provided to surround the second light-emitting layer 26B formed by inkjet printing. As to the display device 43, a second light-emitting layer 26B of four pixels GASO adjacent to one another is formed using one picture-frame bank 24. Such a feature can reduce an area for forming the bank 24, and enlarge the light-emitting areas of the first light-emitting layers 26R, the second light-emitting layer 26B, and the third light-emitting layers 26G. Note that in the display device 43 of this embodiment, each first light-emitting layer 26R and third light-emitting layer 26G is shaped into an island and provided to a pixel GASO. However, the first light-emitting layer 26R and the third light-emitting layer 26G may be provided in any given manner.

As illustrated in FIG. 11(d), as to the display device 44, the first light-emitting layers 26R and the third light-emitting layers 26G formed by photolithography are provided to surround the second light-emitting layer 26B formed by inkjet printing. Note that in the display device 44 of this embodiment, each of the first light-emitting layers 26R and the third light-emitting layers 26G is provided across two pixels GASO arranged side by side. However, the first light-emitting layers 26R and the third light-emitting layers 26G may be provided in any given manner. Note that, as illustrated in FIG. 11(c) and FIG. 11(d), the pixels GASO may be either included in groups alternately arranged, or arranged in a delta arrangement.

Fourth Embodiment

Figure 12:
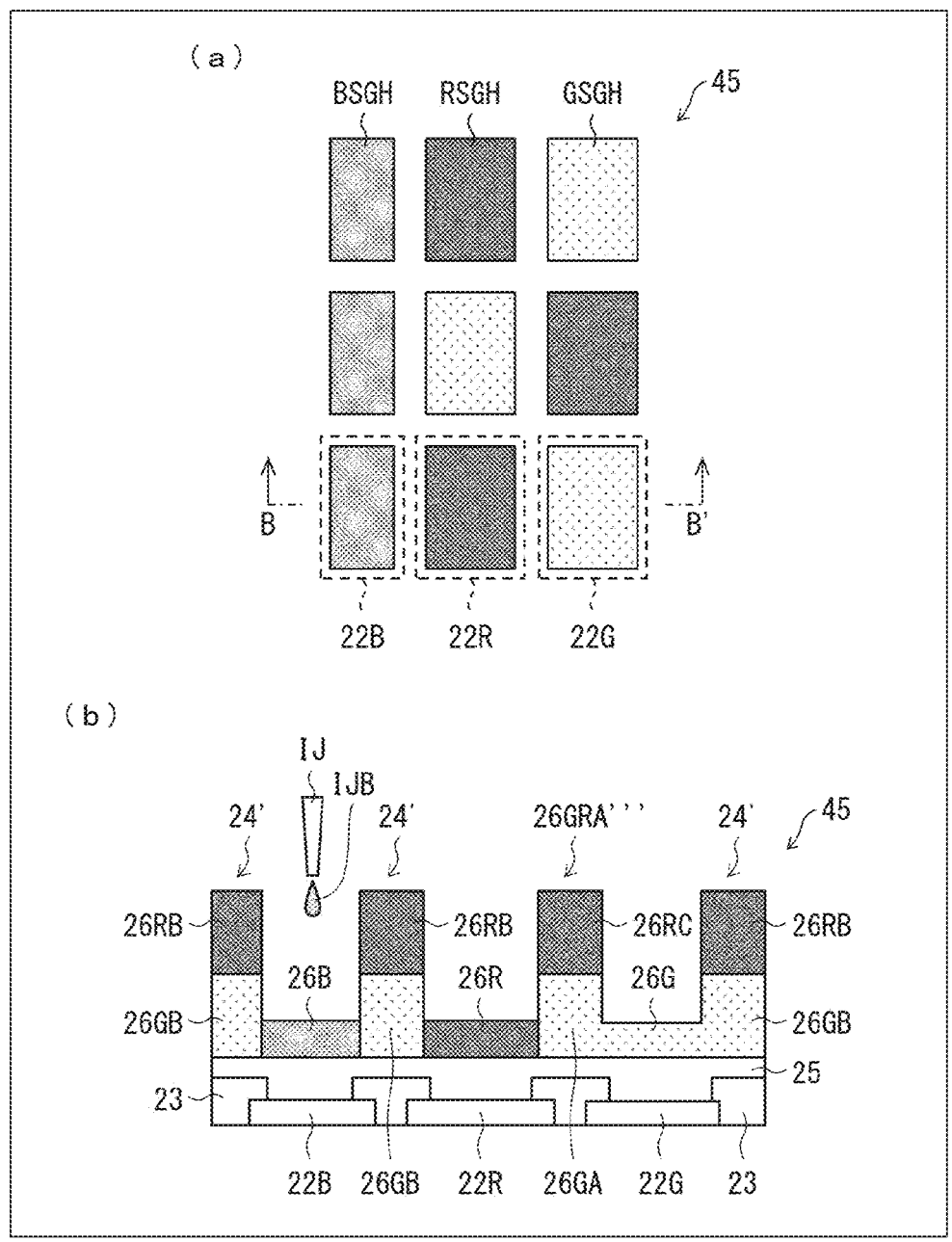
FIG. 12(a) is a plan view of a display device of a fourth embodiment.
FIG. 12(b) is a cross-sectional view of the display device of the fourth embodiment illustrated in FIG. 12(a) and taken along line B-B'.
Figure 13:
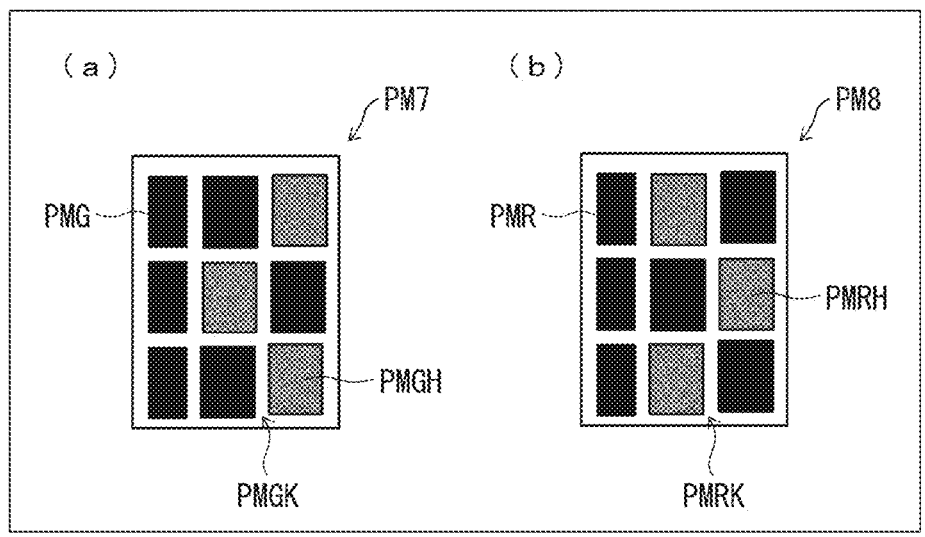
FIG. 13(a) and FIG. 13(b) are plan views illustrating schematic configurations of masks to be used at a step of manufacturing the display device of the fourth embodiment in FIG. 12(a).

Next, with reference to FIGS. 12 and 13, a fourth embodiment of the disclosure is described. A display device 45 of this embodiment is different from the display devices of the first to third embodiments in that, in the display device 45, first electrodes 22R, 22G, and 22B are arranged in a Pen Tile matrix. Otherwise, the display device 45 is the same as the display devices described in the first to third embodiments. For the sake of description, like reference signs designate identical or corresponding constituent features between the drawings of this embodiment and the first to third embodiments. These constituent features will not be elaborated upon.

FIG. 12(a) is a plan view of the display device 45 of the fourth embodiment. FIG. 12(b) is a cross-sectional view of the display device 45 of the fourth embodiment illustrated in FIG. 12(a) and taken along line B-B'.

As illustrated in FIG. 12(a) and FIG. 12(b), the display device 45 has the first electrodes 22R, 22G, and 22B arranged in a Pen Tile matrix. The display device 45 includes the banks 24' each formed of: the same layer 26RB formed of the same material as the material of the first light-emitting layer 26R; and the same layer 26GB formed of the same material as the material of the third light-emitting layer 26G. The display device 45 further includes a first thick portion 26GRA".

Note that the first thick portion 26GRA''' illustrated in FIG. 12(b) is not shaped into a picture frame. Hence, even if the first thick portion 26GRA''' is provided to the display device 45, the first light-emitting layer 26R and the third light-emitting layer 26G can have large light-emitting regions.

FIG. 13(a) and FIG. 13(b) are plan views illustrating schematic configurations of photomasks PM7 and PM8 to be used at a step of manufacturing the display device 45 of the fourth embodiment in FIG. 12(a).

FIG. 13(a) shows the photomask PM7 including: the opening portion PMGK that allows the exposure light L to pass through; the light-blocking portions PRIG that block the exposure light L; and the half-tone portions (the shadow portions) PMGH that allow the exposure light to pass through less than the opening portion PMGK does and more than the light-blocking portions PMG do. The photomask PM7 is a photomask to form: the third light-emitting layer 26G; the same layers 26GB, and a same layer 26GA, all of which are formed in a predetermined region (the third region) as seen in FIG. 12(b). Each of the same layers 26GB is formed of the same material as the material of the third light-emitting layer 26G, and forms a portion of the bank 24' formed thicker than the third light-emitting layer 26G. The same layer 26GA is formed of the same material as the material of the third light-emitting layer 26G, and forms a portion of the first thick portion 26GRA''' formed thicker than the third light-emitting layer 26G.

FIG. 13(b) shows the photomask PM8 including: the opening portion PMRK that allows the exposure light L to pass through; the light-blocking portions PMR that block the exposure light L; and the half-tone portions (the shadow portions) PMRH that allow the exposure light L to pass through less than the opening portion PMRK does and more than the light-blocking portions PMR do. The photomask PM8 is a photomask to form: the first light-emitting layer 26R; the same layers 26RB; and a same layer 26RC all of which are formed in a predetermined region (the first region) as seen in FIG. 12(b). Each of the same layers 26RB is formed of the same material as the material of the first light-emitting layer 26R, and forms a portion of the bank 24' formed thicker than the first light-emitting layer 26R. The same layer 26RC is formed of the same material as the material of the first light-emitting layer 26R, and forms a portion of the first thick portion 26GRA''' formed thicker than the first light-emitting layer 26R.

Fifth Embodiment

Figure 14:
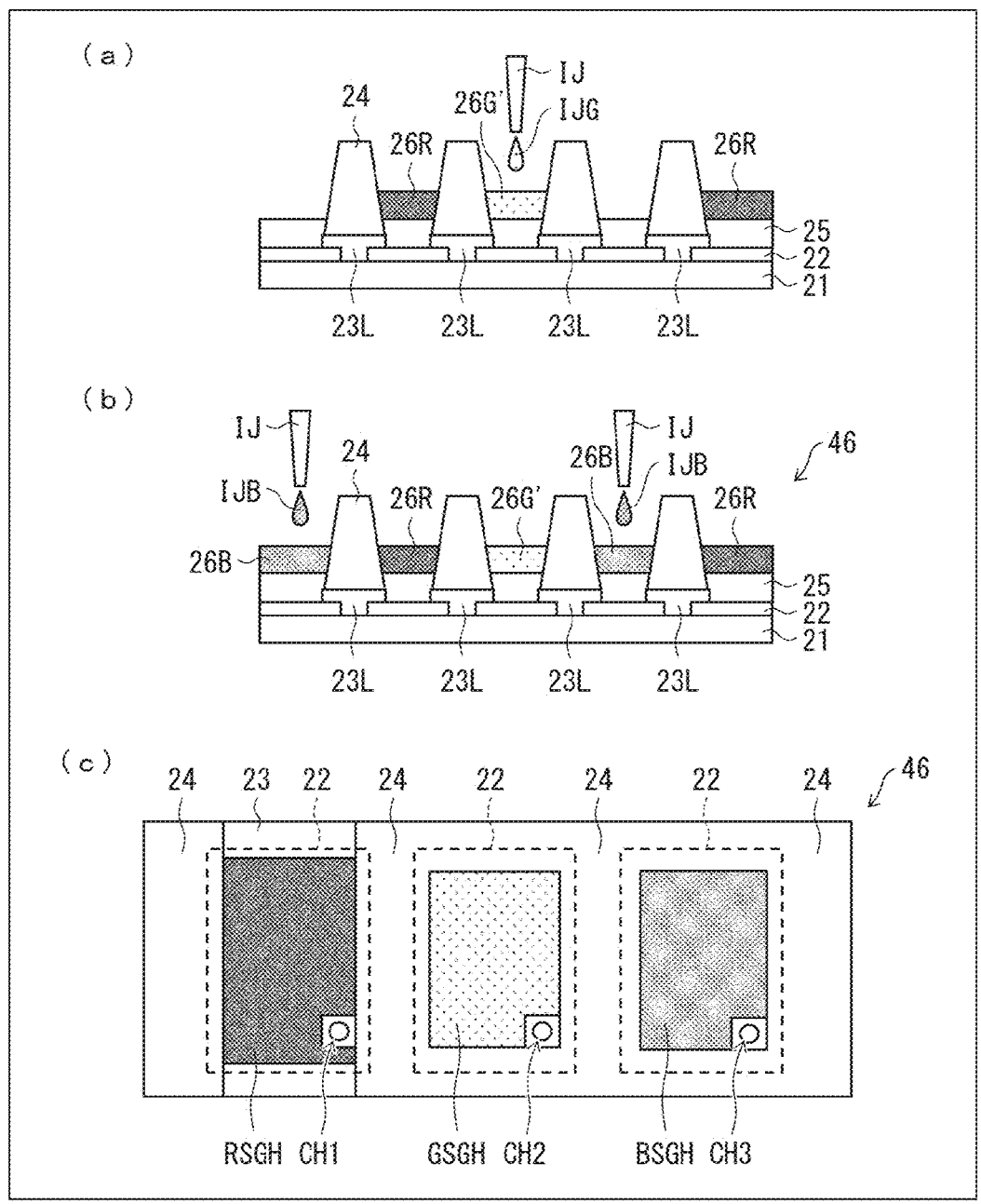
FIG. 14(a) and FIG. 14(b) are views partially illustrating steps of manufacturing a display device of a fifth embodiment.
FIG. 14(c) is a plan view of one pixel included in the display device of the fifth embodiment.

Next, with reference to FIG. 14, a fifth embodiment of the disclosure is described. A display device 46 of this embodiment is different from the display devices of the first to fourth embodiments in that, in the display device 46, not only the second light-emitting layer 26B but also a third light-emitting layer 26G' is formed by inkjet printing. Otherwise, the display device 46 is the same as the display devices described in the first to fourth embodiments. For the sake of description, like reference signs designate identical or corresponding constituent features between the drawings of this embodiment and the first to fourth embodiments. These constituent features will not be elaborated upon.

FIG. 14(a) and FIG. 14(b) are views partially illustrating steps of manufacturing the display device 46 of the fifth embodiment. FIG. 14(c) is a plan view of one pixel included in the display device 46 of the fifth embodiment.

The first light-emitting layers 26R are formed by photolithography. After that, as illustrated in FIG. 14(a), at a forming step of the third light-emitting layer 26G', an inkjet material IJG for forming the third light-emitting layers is delivered with the inkjet apparatus IJ in droplets behind the banks 24 shaped into a picture frame to surround a predetermined region (the third region). The inkjet material IJG contains the third quantum dots (the third light-emitting material) containing ligands emitting a green light, and a solvent. Note that the first light-emitting layers 26R are formed out of the banks 24 formed in a shape of a picture frame.

After that, for example, the inkjet material IJG is treated with heat for a predetermined time period at a temperature of, for example, 50 degrees or higher and 200 degrees or lower, so that the solvent in the inkjet material IJG evaporates. Hence, the third light-emitting layer 26G', which is made of the third quantum dots (the third light-emitting material) containing the ligands, is formed in contact with inner side faces of the banks 24. The third light-emitting layer 26G' has a thickness of 1 nm or more and 100 nm or less.

After that, as illustrated in FIG. 14(b), the second light-emitting layers 26B are formed by inkjet printing.

As illustrated in FIG. 14(c), as to the display device 46, the banks 24 are not formed to have a shape of a picture frame to surround the first light-emitting layer 26R. Such a feature can enlarge the light-emitting region RSGH of the first light-emitting layer 26R.

Note that, as to the display device 46, if the banks 24 are formed of a light-emitting layer, the banks are formed of a same layer made of the same mated al as the material of the first light-emitting layer 26R. Moreover, if upper banks are also formed, the upper banks are formed of a same layer made of the same material as the material of the first light-emitting layer 26R.

Note that, this embodiment exemplifies a case where the inkjet material IJG for forming the third light-emitting layers is formed behind the banks 24 shaped into a picture frame, and the inkjet material IJB for forming the second light-emitting layers is formed behind the banks 24 shaped into a picture frame. However, this embodiment shall not be limited to such a case. For example, the inkjet material IJG for forming the third light-emitting layers may be formed in an inside region of a bank 24 including two partition walls facing each other and separating the inner region from an outer region, and the inkjet material IJB for forming the second light-emitting layers may be formed in an inner region of a bank 24 including two partition walls facing each other and separating the inner region from an outer region. Moreover, one of the inkjet material IJG for forming the third light-emitting layers and the inkjet material IJB for forming the second light-emitting layers may be formed behind banks 24 shaped into a picture frame, and another one of the inkjet material IJG for forming the third light-emitting layers and the inkjet material IJB for forming the second light-emitting layers may be formed behind a bank 24 including two partition walls facing each other and separating an inner region from an outer region.

Sixth Embodiment

Figure 15:
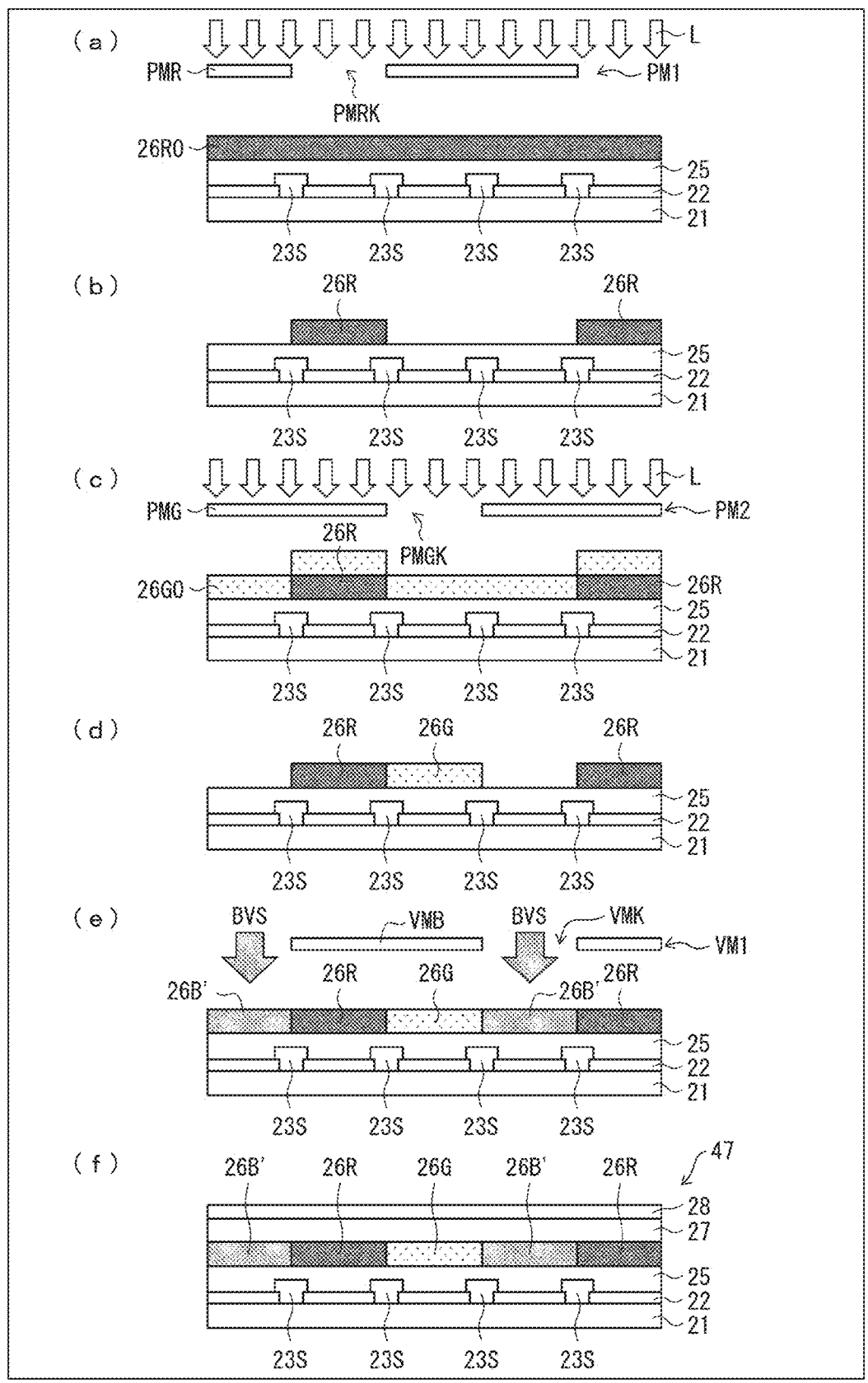
FIG. 15(a) to FIG. 15(f) are views partially illustrating steps of manufacturing a display device of a sixth embodiment.

Next, with reference to FIG. 15, a sixth embodiment of the disclosure is described. A display device 47 of this embodiment is different from the display devices of the first to fifth embodiments in that, in the display device 47, the first light-emitting layers 26R, the second light-emitting layers 26B', and the third light-emitting layer 26G are formed by photolithography and vapor deposition. Otherwise, the display device 47 is the same as the display devices described in the first to fifth embodiments. For the sake of description, like reference signs designate identical or corresponding constituent features between the drawings of this embodiment and the first to fifth embodiments. These constituent features will not be elaborated upon.

FIG. 15(a) to FIG. 15(f) are views partially illustrating steps of manufacturing the display device 47 of the sixth embodiment.

Specifics of FIG. 15(a) to FIG. 15(d) are described in the first embodiment except that no bank 24 is included, and will not be elaborated upon here.

FIG. 15(e) is a drawing showing that the second light-emitting layers 26B' are formed in predetermined regions (the second regions), using a vapor deposition mask VW including: opening portions VMK that allow vapor deposition particles BVS to pass through; and a blocking portions VMB that block the vapor deposition particles BVS.

The second light-emitting layers 26B' are formed by vapor deposition using the vapor deposition mask VM1, so that the second light-emitting layers 26B' can be formed only in the predetermined regions (the second regions). Moreover, the second light-emitting layers 26B' are formed by vapor deposition using the vapor deposition mask WI, so that the second light-emitting layers 26B' are made of light-emitting material (the second light-emitting material) that emits a blue light.

As illustrated in FIG. 15(f), the display device 47 includes no bank 24. Such a feature can enlarge the light-emitting regions of the first light-emitting layers 26R, the second light-emitting layers 26B', and the third light-emitting layer 26G.

This embodiment exemplifies a case where the second light-emitting layers 26B' by vapor deposition. However, this embodiment shall not be limited to such a case. The first light-emitting layers 26R can be formed by vapor deposition if the second light-emitting layers 26B' and the third light-emitting layer 26G are formed in advance by photolithography. Moreover, if the first light-emitting layers 26R and the second light-emitting layers 26B' are formed by photolithography, the third light-emitting layer 26G can be formed by vapor deposition.

Note that this embodiment exemplifies a case where, as illustrated in FIG. 15(e), the second light-emitting layers 26B' are formed in the predetermined regions (the second region) using the vapor deposition mask VM1. However, this embodiment shall not be limited to such a case. For example, the second light-emitting layers 26B' may be formed by spraying mist, using a mask. When the second light-emitting layers 26B' are formed by spraying mist using a mask, for example, the inkjet material 11B for forming the second light-emitting layers, which has already been described in the first embodiment, is sprayed through an opening portion of the mask.

Note that, in forming the second light-emitting layers 26B', vapor deposition requires larger energy to be used at the manufacturing steps than inkjet printing and spraying require. Considering energy consumption, the second light-emitting layers 26B' are formed preferably by inkjet printing or spraying mist.

Additional Remarks

The disclosure shall not be limited to the embodiments described above, and can be modified in various manners within the scope of claims. The technical aspects disclosed in different embodiments are to be appropriately combined together to implement an other embodiment. Such an embodiment shall be included within the technical scope of the disclosure. Moreover, the technical aspects disclosed in each embodiment may be combined to achieve a new technical feature.

The disclosure can be used for a display device and a method for manufacturing the display device.

The invention claimed is:

1. A display device, comprising:
   a substrate;
   a plurality of first electrodes formed on a surface of the substrate and shaped into islands;
   a first light-emitting layer formed on the surface such that to overlap a first electrode, among the plurality of the first electrodes, the first light-emitting layer containing a first light-emitting material and a resin;
   a second light-emitting layer formed on the surface such that to overlap another first electrode, among the plurality of the first electrodes, the second light-emitting layer being made of a second light-emitting material;
   a first bank formed in a shape of a picture frame, or formed to include two partition walls facing each other and separating an inner region from an outer region; and
   a third light-emitting layer formed on the surface such that to overlap yet another first electrode, among the plurality of the first electrodes, the third light-emitting layer containing a third light-emitting material and another resin,
   wherein the second light-emitting layer is provided behind the first bank to be in contact with an inner side face of the first bank,
   the first light-emitting layer is formed out of the first bank, and
   the third light-emitting layer is formed out of the first bank.

2. A display device, comprising:
   a substrate;
   a plurality of first electrodes formed on a surface of the substrate and shaped into islands;
   a first light-emitting layer formed on the surface such that to overlap a first electrode among the plurality of the first electrodes, the first light-emitting layer containing a first light-emitting material and a resin;
   a second light-emitting layer formed on the surface such that to overlap another first electrode among the plurality of the first electrodes, the second light-emitting layer being made of a second light-emitting material;
   a first bank formed in a shape of a picture frame such that to include two first partition walls facing each other and separating an inner region from an outer region;
   a third light-emitting layer formed on the surface such that to overlap yet another first electrode, among the plurality of the first electrodes, the third light-emitting layer being made of a third light-emitting material; and
   a second bank formed in a shape of a picture frame, or formed to include two second partition walls facing each other and separating an inner region from an outer region,
   wherein the second light-emitting layer is provided behind the first bank to be in contact with an inner side face of the first bank,
   the first light-emitting layer is formed out of the first bank and the second bank, and
   the third light-emitting layer is provided behind the second bank to be in contact with an inner side face of the second bank.

3. The display device according to claim 1,
   wherein the first bank is formed of at least one of: a same layer formed of a same material as the material of the first light-emitting layer, or a same layer formed of a same material as the material of the third light-emitting layer.

4. The display device according to claim 1,
   wherein the first bank is formed of a resin material different from the material of the first light-emitting layer and the material of the third light-emitting layer.

5. The display device according to claim 2,
   wherein the first bank and the second bank are formed of a same layer that is formed of a same material as the material of the first light-emitting layer.

6. The display device according to claim 2,
   wherein the first bank and the second bank are formed of a resin material that is different from the material of the first light-emitting layer.

7. The display device according to claim 4, further comprising:
   an upper bank provided on the first bank and formed of at least one of: a same layer formed of a same material as the material of the first light-emitting layer, or a same layer formed of a same material as the material of the third light-emitting layer.

8. The display device according to claim 6, further comprising:
   an upper bank provided on at least one of the first bank or the second bank, and formed of a same layer formed of a same material as the material of the first light-emitting layer.

9. The display device according to claim 1, further comprising:
   a first thick portion including: a first portion of an edge of the first light-emitting layer and a second portion of an edge of the third light-emitting layer, the first portion and the second portion being in contact with, and overlapping, each other,
   wherein the first thick portion overlaps at least a portion between the first electrode overlapping the first light-emitting layer and yet the other first electrode overlapping the third light-emitting layer.

10. The display device according to claim 1,
    wherein the first light-emitting layer has an end portion formed thicker than any other portion of the first light-emitting layer, and
    the third light-emitting layer has an end portion formed thicker than any other portion of the third light-emitting layer.

11. The display device according to claim 1, further comprising:
    a first functional layer overlapping the first light-emitting layer;
    a second functional layer overlapping the third light-emitting layer; and
    a first thick portion including: a first portion of an edge of the first functional layer and a second portion of an edge of the second functional layer, the first portion and the second portion being in contact with, and overlapping, each other,
    wherein the first thick portion overlaps at least a portion between the first electrode overlapping the first light-emitting layer and still the other first electrode overlapping the third light-emitting layer.

12. The display device according to claim 1,
wherein the plurality of first electrodes is arranged in a matrix,
each of the first light-emitting layer and the third light-emitting layer overlaps a single-column first electrode group in which the plurality of first electrodes is arranged in a first direction,
the second light-emitting layer overlaps a double-column first electrode group in which the plurality of first electrodes is arranged in the first direction, and
in a second direction perpendicular to the first direction, each of two first electrodes overlapping the second light-emitting layer belongs to different pixels, the two first electrodes being included in the plurality of first electrodes.

13. A method for manufacturing a display device, the method comprising:
forming, by photolithography, a first light-emitting layer in a plurality of first regions on a surface of a substrate;
forming a second light-emitting layer after forming the first light-emitting layer, the second light-emitting layer being formed not in the plurality of first regions and only in a plurality of second regions on the surface, and the plurality of second regions being different from the plurality of first regions; and
forming a third light-emitting layer after forming the first light-emitting layer, the third light-emitting layer being formed not in the plurality of first regions or in the plurality of second regions and only in a plurality of third regions on the surface, and the plurality of third regions being different from the plurality of first regions and the plurality of second regions.

14. The method for manufacturing the display device according to claim 13, further comprising:
before forming the first light-emitting layer, the second light-emitting layer, and the third light-emitting layer:
forming a plurality of first electrodes that is formed on the surface of the substrate and that is shaped into islands, and
forming edge covers that fill spaces between the plurality of the first electrodes and that cover edges of the plurality of first electrodes, and
forming, on portions of the edge covers:
a plurality of first banks surrounding the plurality of second regions, and
a plurality of second banks surrounding the plurality of third regions,
wherein in forming the first light-emitting layer, the first light-emitting layer is formed out of the plurality of first banks and the plurality of second banks,
in forming the second light-emitting layer, the second light-emitting layer is formed behind the plurality of first banks to be in contact with inner side faces of the plurality of first banks, and
in forming the third light-emitting layer, the third light-emitting layer is formed behind the plurality of second banks to be in contact with inner side faces of the plurality of second banks.

15. The method for manufacturing the display device according to claim 13, further comprising:
before forming the first light-emitting layer, the second light-emitting layer, and the third light-emitting layer:
forming a plurality of first electrodes that is formed on the surface of the substrate and that is shaped into islands, and
forming edge covers that fill spaces between the plurality of the first electrodes and that cover edges of the plurality of first electrodes,
wherein in forming the first light-emitting layer, the first light-emitting layer is formed on portions of the edge covers, a plurality of first banks is formed to surround the plurality of second regions, and a plurality of second banks is formed to surround the plurality of third regions,
in forming the second light-emitting layer, the second light-emitting layer is formed behind the plurality of first banks to be in contact with inner side faces of the plurality of first banks, and
in forming the third light-emitting layer, the third light-emitting layer is formed behind the plurality of second banks to be in contact with inner side faces of the plurality of second banks.

* * * * *